(12) United States Patent
Chu et al.

(10) Patent No.: US 9,721,671 B2
(45) Date of Patent: Aug. 1, 2017

(54) MEMORY DEVICE WHICH PERFORMS VERIFY OPERATIONS USING DIFFERENT SENSE NODE PRE-CHARGE VOLTAGES AND A COMMON DISCHARGE PERIOD

(71) Applicant: SanDisk Technologies Inc., Plano, TX (US)

(72) Inventors: Alexander Chu, San Francisco, CA (US); Jong Hak Yuh, Pleasanton, CA (US); Kwang-Ho Kim, Pleasanton, CA (US); Yenlung Li, San Jose, CA (US); Farookh Moogat, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/849,879

(22) Filed: Sep. 10, 2015

(65) Prior Publication Data

US 2017/0076812 A1   Mar. 16, 2017

(51) Int. Cl.
  *G11C 7/00* (2006.01)
  *G11C 16/34* (2006.01)
  (Continued)

(52) U.S. Cl.
  CPC ............ *G11C 16/3459* (2013.01); *G11C 7/12* (2013.01); *G11C 11/5642* (2013.01);
  (Continued)

(58) Field of Classification Search
  CPC ................ G11C 16/26; G11C 11/5642; G11C 2211/5621; G11C 16/24; G11C 16/3459; G11C 17/12; G11C 16/30
  (Continued)

(56) References Cited

U.S. PATENT DOCUMENTS 6,496,434 B1   12/2002  Nobunaga
6,813,214 B2 *  11/2004  Cho .................... G11C 7/1051
                                                365/185.17
(Continued)

FOREIGN PATENT DOCUMENTS

WO   WO2014/190049 A1   11/2014

OTHER PUBLICATIONS

Invitation to Pay Additional Fees dated Sep. 15, 2016, International Application No. PCT/US2016/036260.
(Continued)

*Primary Examiner* — David Lam
(74) *Attorney, Agent, or Firm* — Vierra Magen Marcus LLP

(57) ABSTRACT

Sense circuits in a memory device can be pre-charged to different levels in a sensing process to reduce the amount of time used for sensing. During sensing of first and second memory cells, a control circuit pre-charges first and second sense circuits to first and second voltages, respectively. The first and second sense circuits are associated with the first and second memory cells, respectively. Also, during the sensing, a control gate voltage is applied to the first and second memory cells. The control circuit allows the first and second sense node voltages to discharge in a common discharge period and the cells are sensed using a common trip condition. The first and second memory cells are therefore subject to different concurrent verify tests.

18 Claims, 20 Drawing Sheets

(51) Int. Cl.
*G11C 16/30* (2006.01)
*G11C 16/24* (2006.01)
*G11C 16/26* (2006.01)
*G11C 7/12* (2006.01)
*G11C 11/56* (2006.01)

(52) U.S. Cl.
CPC .............. *G11C 16/24* (2013.01); *G11C 16/26* (2013.01); *G11C 16/30* (2013.01); *G11C 2211/5621* (2013.01)

(58) Field of Classification Search
USPC ............ 365/185.17, 185.18, 185.21, 185.22, 365/185.25, 185.33, 203
See application file for complete search history.

(56) References Cited

U.S. PATENT DOCUMENTS

| | | | |
|---|---|---|---|
| 7,515,476 B2 * | 4/2009 | Park | G11C 16/0483 365/185.17 |
| 7,692,987 B2 * | 4/2010 | Edahiro | G11C 16/26 365/185.25 |
| 7,974,134 B2 * | 7/2011 | Zhang | G11C 11/5642 365/185.21 |
| 8,842,476 B2 | 9/2014 | Sakai et al. | |
| 8,928,367 B2 | 1/2015 | Wang et al. | |
| 9,355,724 B2 * | 5/2016 | Oh | G11C 16/0483 |
| 2006/0140007 A1 | 6/2006 | Cernea et al. | |
| 2009/0080265 A1 | 3/2009 | Mokhlesi et al. | |
| 2014/0003153 A1 | 1/2014 | Mui et al. | |
| 2014/0198594 A1 | 7/2014 | McCombs | |
| 2014/0347928 A1 | 11/2014 | Lee | |
| 2014/0347934 A1 | 11/2014 | Goda | |
| 2015/0194194 A1 | 7/2015 | Arsovski et al. | |

OTHER PUBLICATIONS

International Search Report & The Written Opinion dated No. 8, 2016, International Application No. PCT/US2016/036260.

* cited by examiner

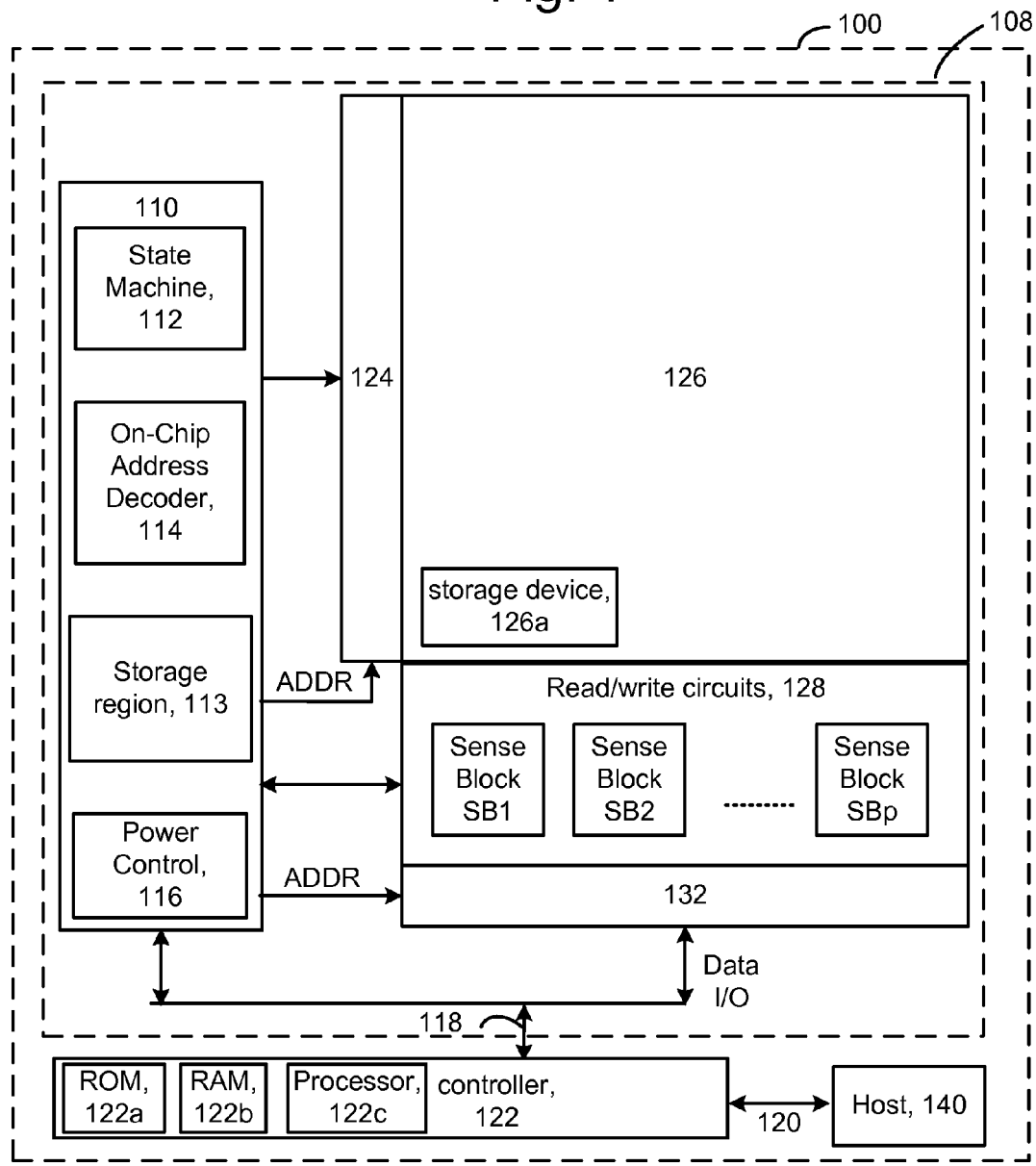

Fig. 2

Code in storage device (150)

boot code (151)

control code / set of instructions (160)

instructions for providing a signal to a latch to cause a bit which is stored by the latch to be provided on a bus which is connected to a control gate of a first transistor in the sense circuit (161);

instructions for, while the bit is provided on the bus, providing a first, higher control gate voltage to a second transistor in the sense circuit, to cause the second transistor to pre-charge a sense node of the sense circuit to a first sense node voltage if the bit is represented by the first bit voltage or not pre-charge the sense node to the first sense node voltage if the bit is represented by the second bit voltage (162);

instructions for reading bits from additional latches associated with the sense circuit (163);

instructions for determining from the bits from the additional latches that the threshold voltage of the memory cell has not exceeded the final verify voltage of the data state (164);

instructions for, in response to the determining that the threshold voltage of the memory cell has not exceeded the final verify voltage, providing a voltage on the bus which provides the first transistor in a conductive state and providing a second, lower control gate voltage, lower than the higher control gate voltage, to the second transistor in the sense circuit (165).

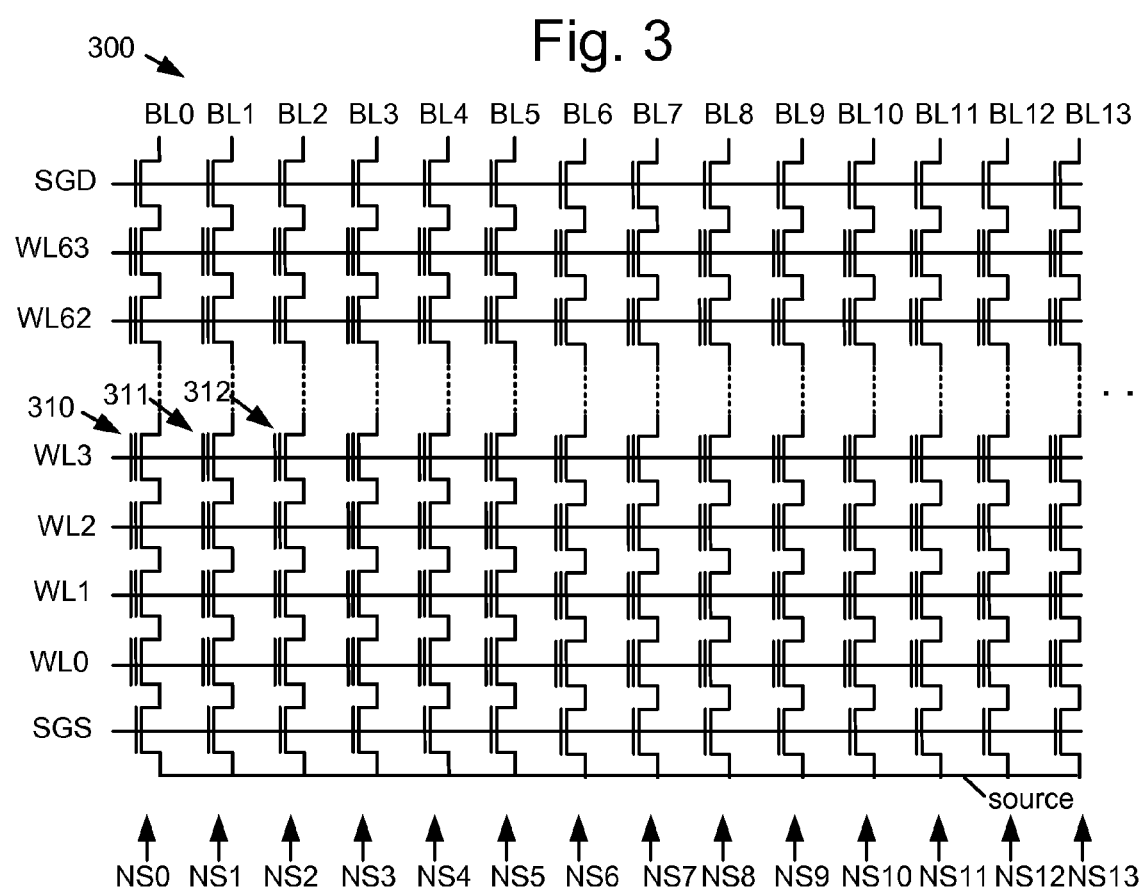

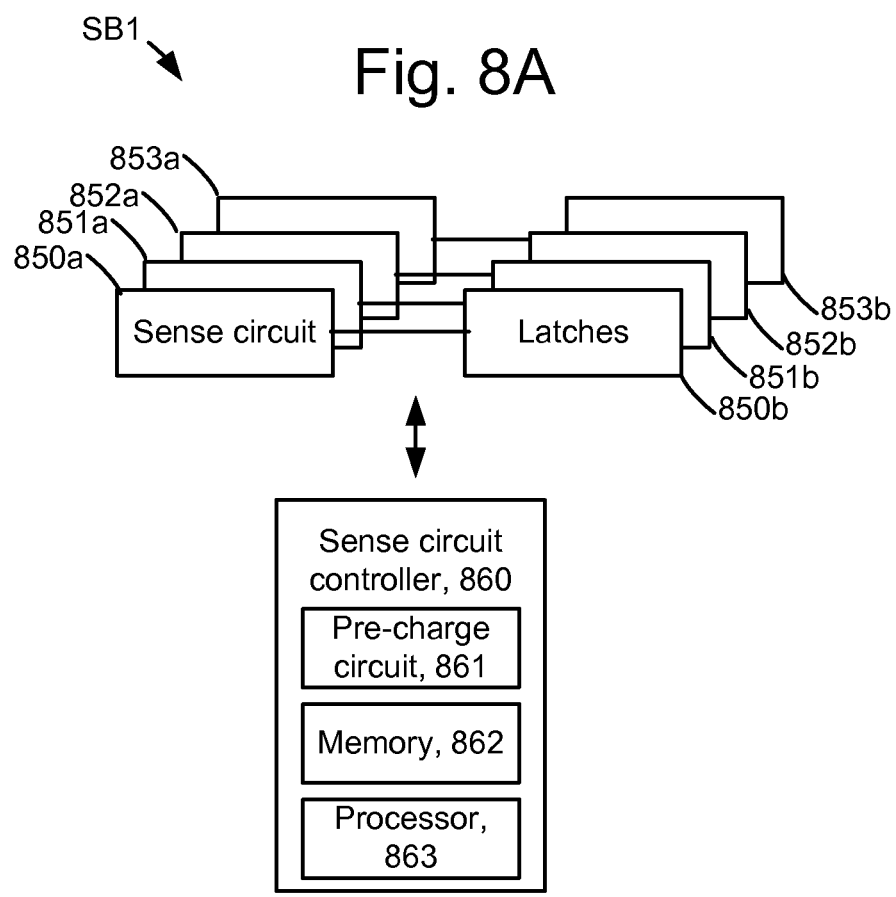

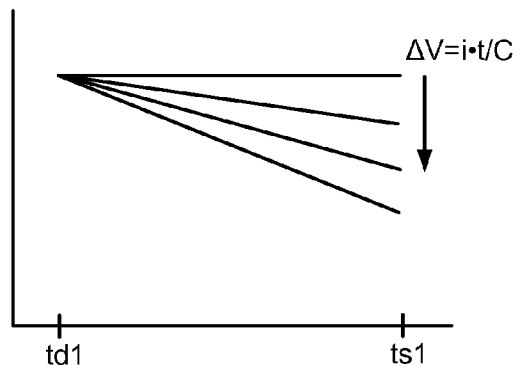

Fig. 8C

| Vth | offset verify latch | data state latch |
|---|---|---|
| Vth<VO | false | data state |
| VO<Vth<VF | true | data state |
| Vth>VF | true | lockout |

```
Case 1:
Time:     VO cell                    VF cell
t7        pre-charge to VsenVO       do not pre-charge (0 V)
t9        no change (VsenVO)         pre-charge to VsenVF Case 2:
Time:     VO cell                    VF cell
t7        do not pre-charge (0 V)    pre-charge to VsenVF
t9        pre-charge to VsenVO       no change (VsenVF)

Case 3:
Time:     VO cell                    VF cell
t7        pre-charge to VsenVF       pre-charge to VsenVF
t9        pre-charge to VsenVO       no change (VsenVF)

Case 4:
Time:     VO cell                    VF cell
t7        pre-charge to VsenVO       pre-charge to VsenVO
t9        no change (VsenVO)         discharge to 0 V
t12       no change (VsenVO)         pre-charge to VsenVF
```

Fig. 9C

| Latch: | | Er | A | Aslow | Ainh | B | Bslow | Binh | C | Cslow | Cinh |
|---|---|---|---|---|---|---|---|---|---|---|---|
| offset verify | 900 | 1 | 0 | 1 | 1 | 0 | 1 | 1 | 0 | 1 | 1 |
| upper page | 901 | 1 | 0 | 0 | 1 | 0 | 0 | 1 | 1 | 1 | 1 |
| lower page | 902 | 1 | 1 | 1 | 1 | 0 | 0 | 1 | 0 | 0 | 1 |

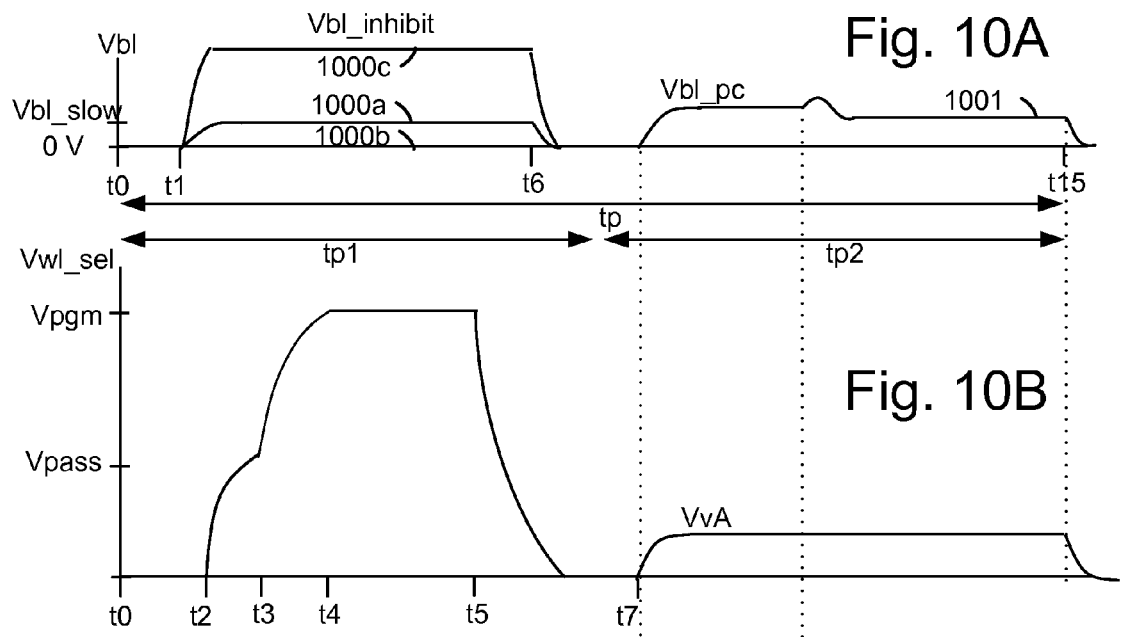
Fig. 10A
Fig. 10B
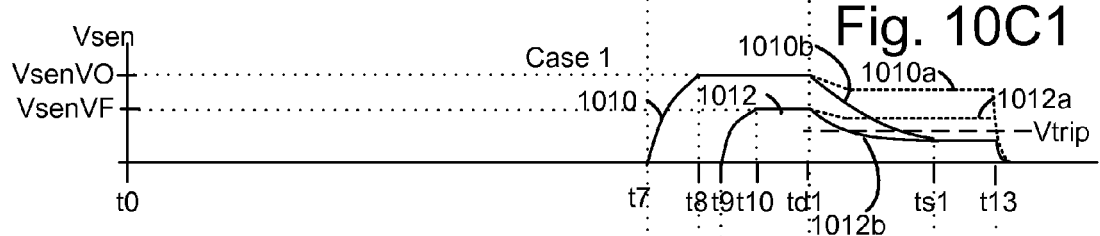
Fig. 10C1
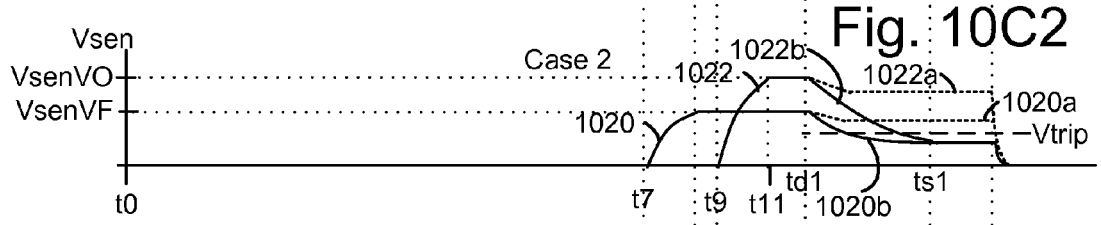
Fig. 10C2
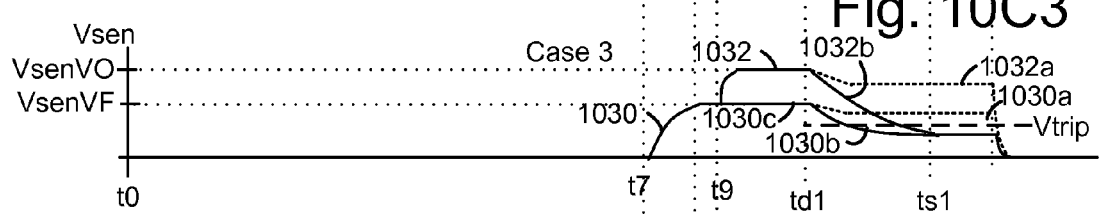
Fig. 10C3
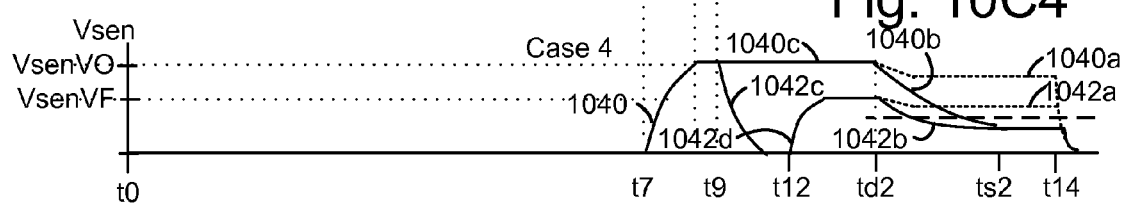
Fig. 10C4

MEMORY DEVICE WHICH PERFORMS VERIFY OPERATIONS USING DIFFERENT SENSE NODE PRE-CHARGE VOLTAGES AND A COMMON DISCHARGE PERIOD

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A memory device can include memory cells that are arranged in horizontally in a two-dimensional (2D) memory structure or vertically in a three-dimensional (3D) memory structure such as a stacked memory structure. Each memory cell includes a charge storing material such as a floating gate or a charge-trapping material, and can be programmed to represent a data state based on an amount of charge in the charge storing material.

Moreover, the memory cells may be arranged in strings, for instance, where select gate transistors are provided at the ends of the string to selectively connect a channel of the string to a source line or bit line. Sensing operations are typically performed using a sense circuit which is connected to the bit line. However, various challenges are presented in operating such memory devices.

BRIEF DESCRIPTION OF THE DRAWINGS

FIG. 1 is an example block diagram of a non-volatile memory device.

FIG. 2 depicts code which may be executed by the processor 122c of FIG. 1 or the processor 863 in the sense block of FIG. 8A.

FIG. 3 depicts a block of NAND flash memory cells as an example of the memory structure 126 of FIG. 1.

FIG. 8A depicts an example block diagram of the sense block SB1 of FIG. 1.

FIG. 8C depicts current sensing based on a change in voltage, in an example implementation of the trip latches of FIG. 8B.

FIG. 9A is a table depicting values of the latches of the sense circuits of FIG. 8B during a program operation.

FIG. 9B is a table depicting four example cases of pre-charge operations for sense nodes in the sense circuits of FIG. 8B during a program operation, consistent with step 605 of FIG. 6A.

FIG. 9C depicts example values in data latches during a program operation, consistent with FIG. 9A.

FIG. 10A depicts an example bit line voltage in a time period tp, consistent with FIG. 7A-7C.

FIG. 10B depicts an example selected word line voltage in a time period tp, consistent with FIG. 7A-7C.

FIG. 10C1 depicts an example sense node voltage in a time period tp, consistent with FIG. 7A-7C and the pre-charging case 1 of FIG. 9D.

FIG. 10C2 depicts an example sense node voltage in a time period tp, consistent with FIG. 7A-7C and the pre-charging case 2 of FIG. 9D.

FIG. 10C3 depicts an example sense node voltage in a time period tp, consistent with FIG. 7A-7C and the pre-charging case 3 of FIG. 9D.

FIG. 10C4 depicts an example sense node voltage in a time period tp, consistent with FIG. 7A-7C and the pre-charging case 4 of FIG. 9D.

DETAILED DESCRIPTION

Figure 4:
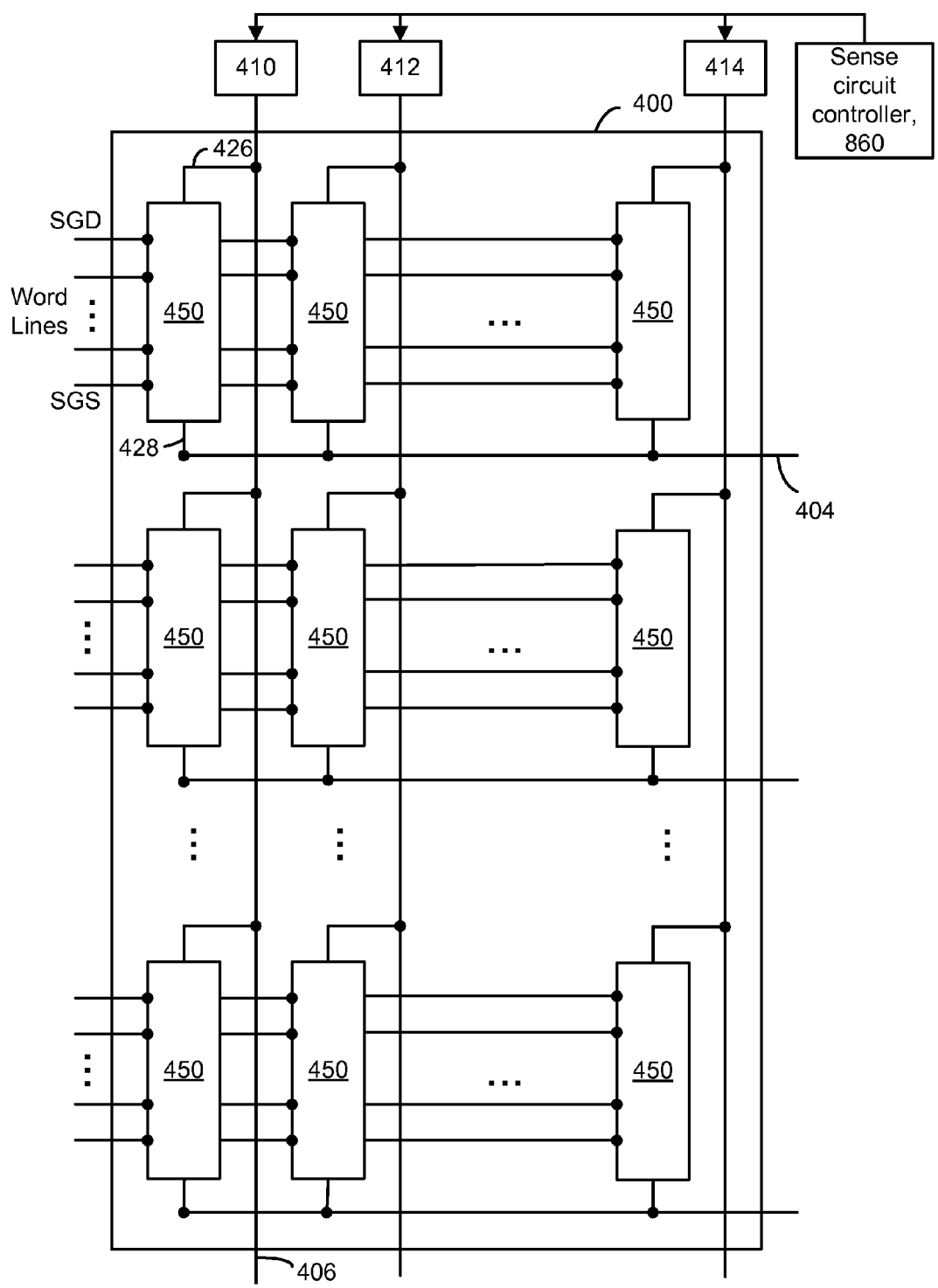
FIG. 4 depicts an example of an array 400 of NAND cells as another example of the memory structure 126 of FIG. 1.

Techniques are provided for performing concurrent sensing operations for memory cells, where the sensing operations sense different threshold voltage levels for different memory cells while a common control gate voltage is applied to the memory cells.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 5A). In a three-bit per cell memory device, there are eight data states including the erased state and seven higher data states referred to as the A, B, C, D, E, F and G data states (see FIG. 5B). In a four-bit per cell memory device, there are sixteen data states including the erased state and fifteen higher data states referred to as the A, B, C, D, E, F, G, H, I, J, K, L, M, N and O data states (see FIG. 5C).

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and can be lower than the final verify voltage. When a memory cell is close to completion of programming, the programming speed of the memory cell can be reduced such as by elevating a voltage of a respective bit line during one or more subsequent program voltages. For example, in FIG. 5A, a memory cell which is to be programmed to the A data state can be subject to verify tests at VvAO, an offset verify voltage of the A data state, and VvA, a final verify voltage of the A data state.

By slowing the programming speed just before a memory cell completes programming, narrower Vth distributions can be achieved. However, time is consumed in performing the verify operations. For example, typically, a verify test for VvAO in FIG. 5A involves applying VvAO to the control gates of the selected memory cells via a selected word line, pre-charging sense circuits which are connected to the selected memory cells via respective bit lines and observing an amount of discharge in the sense circuits for a specified discharge period. The amount of discharge is determined based on whether the voltage of the sense circuit falls below a trip voltage. If the voltage of the sense circuit falls below the trip voltage, this indicates the memory cell is in a conductive state. In other words, the Vth of the memory cell is less than the voltage on the control gate. If the voltage of the sense circuit does not fall below the trip voltage, this indicates the memory cell is in a non-conductive state. In other words, the Vth of the memory cell is greater than the voltage on the control gate.

Figure 5A:
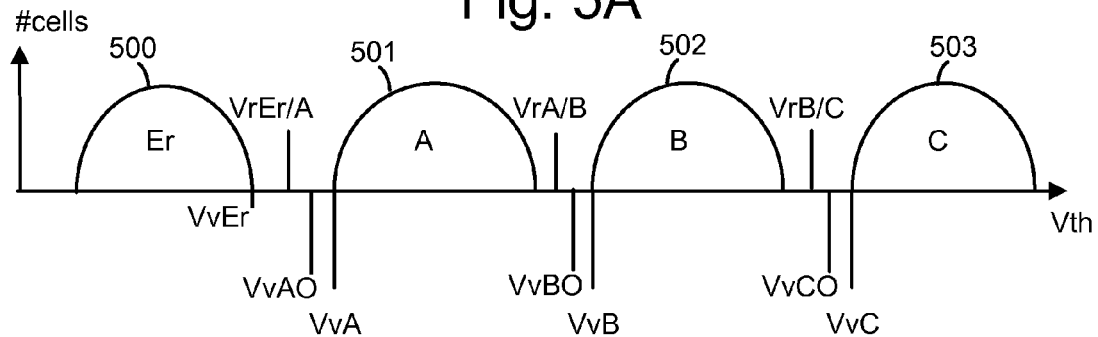
FIG. 5A depicts a threshold voltage (Vth) distribution of a set of memory cells along with read and verify voltages, where there are four data states.

A verify test for VvA in FIG. 5A, similarly involves applying VvA to the selected memory cells, pre-charging the sense circuits and observing an amount of discharge in the sense circuits. The time for the verify operations is therefore doubled when two verify tests are performed sequentially.

Techniques provided herein allow multiple verify tests to be performed concurrently by pre-charging the sense circuits to a different voltage for each verify test, then observing an amount of discharge in the sense circuits. The different pre-charge voltages can be set so that a common discharge period and trip voltage are used in the multiple verify tests. Since the discharge periods are concurrent, the time for the verify operations is reduced. In particular, a higher pre-charge voltage can be set in the sense circuits of the memory cells which are being verified at the offset verify voltage than in the sense circuits of the memory cells which are being verified at the final verify voltage.

Moreover, the techniques are compatible with various sense circuit designs. In one approach, a latch referred to as a offset verify latch is used to store a bit which indicates whether the Vth of a memory cell being sensed exceeds an offset verify voltage of a data state (e.g., VvAO for the A data state). In one approach, the bit is transferred from the offset verify latch to a local bus, and a voltage of the bit determines whether a pre-charge to a first voltage will occur at a first pre-charge time. This approach avoids using time for the controller to read the offset verify latch and set a voltage on the bus. In another approach, the controller reads the offset verify latch and sets a voltage on the bus which determines whether a pre-charge will occur. When the controller provides a common pre-charge voltage to the sense circuits, each sense circuit may be pre-charged to a first voltage depending on the voltage of the bus.

At a second pre-charge time, the controller reads data state latches of a sense circuit to determine whether the Vth of the memory cell is in a range between the offset verify voltage and the final verify voltage. If the cell is in this range, a verify test is performed at the final verify voltage of a data state (e.g., VvA for the A data state). The controller can set a voltage on the bus of each sense circuit to enable or disable a pre-charge. When the controller provides a second common pre-charge voltage to the sense circuits, each sense circuit may be pre-charged to a second voltage depending on the voltage of the bus.

The techniques can be used generally to verify memory cells to different Vth levels. In one implementation, the different Vth levels as are associated with different data states. The techniques can be used in verify and other sensing operations.

FIG. 1 is an example block diagram of a non-volatile memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming and sensing parameters (e.g., bit line voltages and verify voltages).

The on-chip address decoder 114 provides an address interface between that used by the host or a memory controller to the hardware address (ADDR) used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 2 depicts code which may be executed by the processor 122c of FIG. 1 or the processor 863 in the sense block of FIG. 8A. The code 150 is used by the controller to access the memory structure such as for programming, read and erase operations. The code can include boot code 151 and control code (e.g., a set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Or, the processor 863 fetches boot code from the memory 862 for execution. Once the control code is loaded, it is executed by the processor. The control code can include drivers to perform basic tasks such as controlling and allocating memory, prioritizing the processing of instructions, and controlling input and output ports (Data I/O).

The set of instructions can include instructions to perform a program operation for a set of memory cells. These instructions can include instructions for providing a signal to a latch to cause a bit which is stored by the latch to be provided on a bus which is connected to a control gate of a first transistor in the sense circuit (161); instructions for, while the bit is provided on the bus, providing a first, higher control gate voltage to a second transistor in the sense circuit, to cause the second transistor to pre-charge a sense node of the sense circuit to a first sense node voltage if the bit is represented by the first bit voltage or not pre-charge the sense node to the first sense node voltage if the bit is represented by the second bit voltage (162); instructions for reading bits from additional latches associated with the sense circuit (163); instructions for determining from the bits from the additional latches that the threshold voltage of the memory cell has not exceeded the final verify voltage of the data state (164); and instructions for, in response to the determining that the threshold voltage of the memory cell has not exceeded the final verify voltage, providing a voltage on the bus which provides the first transistor in a conductive state and providing a second, lower control gate voltage, lower than the higher control gate voltage, to the second transistor in the sense circuit (165). Generally, the control code can include instructions to perform the functions described herein, including the steps of the processes of FIGS. 6A, 6B and 11A-11D.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

The state machine may be fully implemented in hardware, or a combination of hardware and software. For example, the state machine may include one or more processors and one or more processor readable storage devices that store processor readable code (e.g., software) for programming the one or more processors to perform the methods described herein.

The controller may be fully implemented in hardware, or a combination of hardware and software. For example, the controller may include one or more processors and one or more processor readable storage devices that store processor readable code (e.g., software) for programming the one or more processors to perform the methods described herein.

FIG. 3 depicts a block 300 of NAND flash memory cells as an example of the memory structure 126 of FIG. 1. The block includes a number of NAND strings e.g., NS0, NS1, NS2, NS3, NS4, NS5, NS6, NS7, NSB, NS9, NS10, NS11, NS12 and NS13, and respective bit lines, e.g., BL0, BL1, BL2, BL3, BL4, BL5, BL6, BL7, BL8, BL9, BL10, BL11, BL12, BL13. Each NAND string is connected at one end to a drain select gate (SGD) transistor, and the control gates of the drain select gate transistors are connected via a common SGD line. The NAND strings are connected at their other end to a source select gate transistor which, in turn, is connected to a common source line. Sixty-four word lines, for example, WL0-WL63, extend between the source select gate transistors and the drain select gates. An example word line WL3 includes one memory cell from NAND string, e.g., memory cells 310, 311 and 312 in NS0, NS1 and NS2, respectively, and so forth. During a sensing operation, each memory cell which is connected to a selected word line may be sensed, in one approach.

FIG. 4 depicts an example of an array 400 of NAND cells as another example of the memory structure 126 of FIG. 1. Along each column, a bit line 406 is coupled to the drain terminal 426 of the drain select gate for the NAND string 450. Along each row of NAND strings, a source line 404 may connect all the source terminals 428 of the source select gate transistors of the NAND strings.

The array of storage elements is divided into a large number of blocks of storage elements such as the block 300 of FIG. 3. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data may be 512 bytes, corresponding to the size of a sector in magnetic disk drives. Overhead data may include an additional 16-20 bytes. A large number of pages form a block, anywhere from 8 pages, for example, up to 32, 64 or more pages. In some embodiments, a row of NAND strings comprises a block.

Additionally, sense circuits such as sense amplifiers can be connected to each bit line, or shared among bit lines. Examples include sense circuits 410, 412, . . . , 414. A sense circuit controller 860 (see also FIG. 8B) is a control circuit which provide a voltage to each sense circuit for use in setting a voltage of a sense node in each sense circuit during sensing operations involving the associated bit lines and one or more selected storage elements. Details of example sense circuits are discussed further below.

FIG. 5A depicts a threshold voltage (Vth) distribution of a set of memory cells along with read and verify voltages, where there are four data states. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective final verify voltages of respective data states. All memory cells may initially be in an erased state at the beginning of the programming pass.

Example Vth distributions for the memory cell array are provided for a case where each memory cell stores two bits of data in one of four possible Vth ranges. One bit represents lower page data and the other bit represents the upper page data.

A first Vth distribution 500 is provided for erased (Er) state memory cells. Vth distributions 501, 502 and 503 represent data states A, B and C, respectively, which are reached by memory cells when their Vth exceeds the final verify voltage VvA, VvB or VvC, respectively. VvEr is an erase verify voltage. Additionally, the data states A, B and C have offset verify voltages VvAO, VvBO and VvCO, respectively.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

The offset verify voltages may be offset from the final verify voltages by a common increment or by different increments. One or more offset verify voltages could be provided for a data state. To obtain narrow Vth distributions while minimizing a programming time penalty, a slow programming mode may be implemented for a memory cell when its Vth exceeds an offset verify voltage but is still below the final verify voltage of the data state. A slow programming mode may be implemented for a memory cell by raising an associated bit line voltage to a positive value during a program voltage. Prior to the slow programming mode, the memory cell may be in a fast programming mode in which Vbl=0 V to maximize the programming speed. Thus, the Vth of a memory cell can increase at a relatively fast rate with each program voltage initially in the program operation until the Vth moves closer to the final verify voltage. At this time, the Vth of the memory cell increases at a relatively slow rate with each program voltage so that it does not excessively overshoot the final verify voltage. The memory cell is locked out from further programming when its Vth exceeds the final verify voltage, e.g., by setting Vbl to a high level such as 2-3 V during subsequent program voltages of the program operation.

If multiple offset verify voltages are used, Vbl can be set to one level when the Vth of a memory cell exceeds a first offset verify voltage and to another, higher level when the Vth exceeds a second offset verify voltage which is greater than the first offset verify voltage.

Figure 5B:
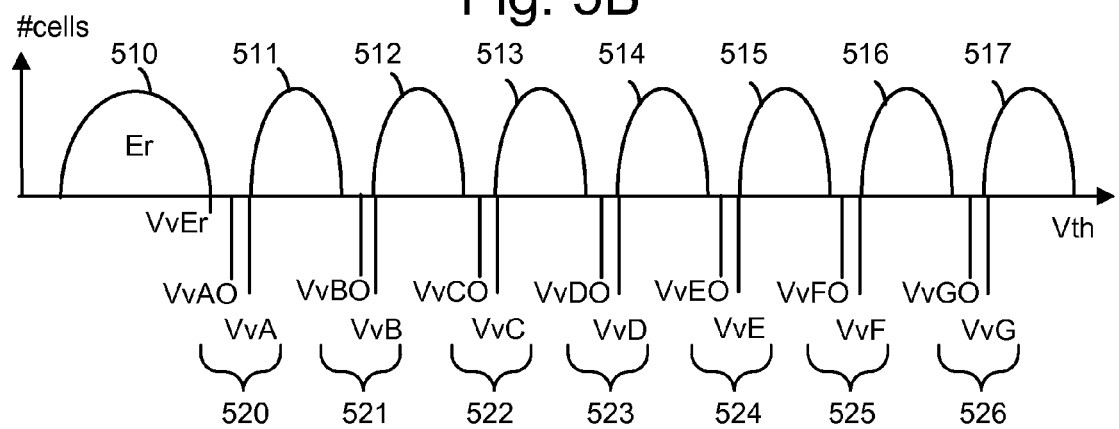
FIG. 5B depicts a threshold voltage (Vth) distribution of a set of memory cells along with read and verify voltages, where there are eight data states.

FIG. 5B depicts a threshold voltage (Vth) distribution of a set of memory cells along with read and verify voltages, where there are eight data states. A first Vth distribution 510 is provided for erased (Er) state memory cells. Vth distributions 511, 512, 513, 514, 515, 516 and 517 represent data states A, B, C, D, E, F and G, respectively, which are reached by memory cells when their Vth exceeds the final verify voltage VvA, VvB, VvC, VvD, VvE, VvF and VvG, respectively. Additionally, the data states A, B, C, D, E, F and G and C have the offset verify voltages VvAO, VvBO, VvCO, VvDO, VvEO, VvFO and VvGO, respectively. The parentheses 520-526 identify verify levels which are tested concurrently in a common/single sensing operation. For example, the parentheses 520, 521, 522, 523, 524, 525 and 526 indicate that VvAO and VvA, VvB and VvBO, VvC and VvCO, VvD and VvDO, VvE and VvEO, VvF and VvFO and VvG and VvGO, respectively, are tested concurrently.

Figure 5C:
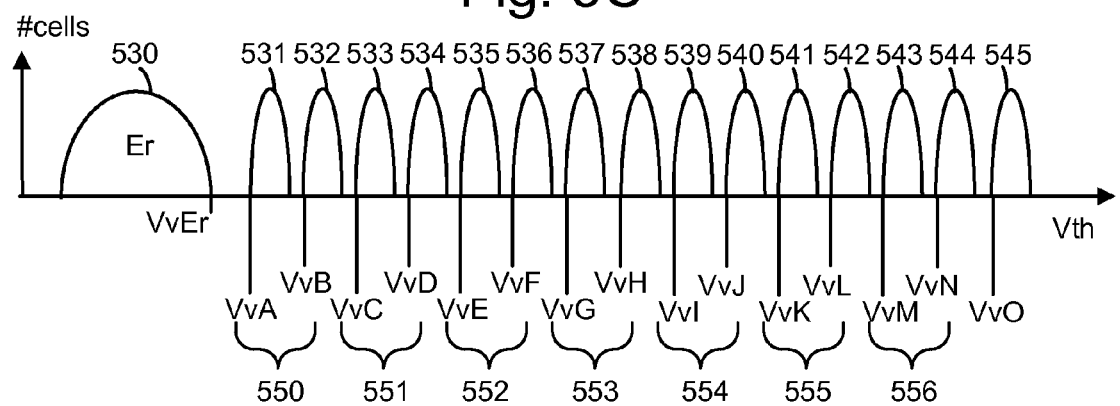
FIG. 5C depicts a threshold voltage (Vth) distribution of a set of memory cells along with verify voltages, where there are sixteen data states.

FIG. 5C depicts a threshold voltage (Vth) distribution of a set of memory cells along with verify voltages, where there are sixteen data states. A first Vth distribution 530 is provided for erased (Er) state memory cells. Vth distributions 531, 532, 533, 534, 535, 536, 537, 538, 539, 540, 541, 542, 543, 544 and 545 represent data states A, B, C, D, E, F, G, H, I, J, K, L, M, N and O, respectively, which are reached by memory cells when their Vth exceeds the final verify voltage VvA, VvB, VvC, VvD, VvE, VvF, VvG, VvH, VvI, VvJ, VvK, VvL, VvM, VvN and VvO, respectively. In this example, the data states do not have offset verify voltages. However, it is possible to provide such offset verify voltages in a manner analogous to FIGS. 5A and 5B. The braces 550-556 identify verify levels which are tested concurrently in a common sensing operation. For example, the braces 550, 551, 552, 553, 554, 555 and 556 indicate that VvA and VvB, VvC and VvD, VvE and VvF, VvG and VvH, VvI and VvJ, VvK and VvL, and VvM and VvN, respectively, are tested concurrently. VvO is tested by itself in this example.

This scenario therefore allows concurrent sensing of verify voltages for multiple data states, e.g., two adjacent data states, including one data state (e.g., B, D, F, H, J, L, N) and another data state (e.g., A, C, E, G, I, K, M, respectively) which is below the one data state. Generally, there will be some limit to the difference between the verify voltages which are tested in concurrent sensing based on a limit to the difference between the pre-charge levels in the sense nodes.

Figure 5D:
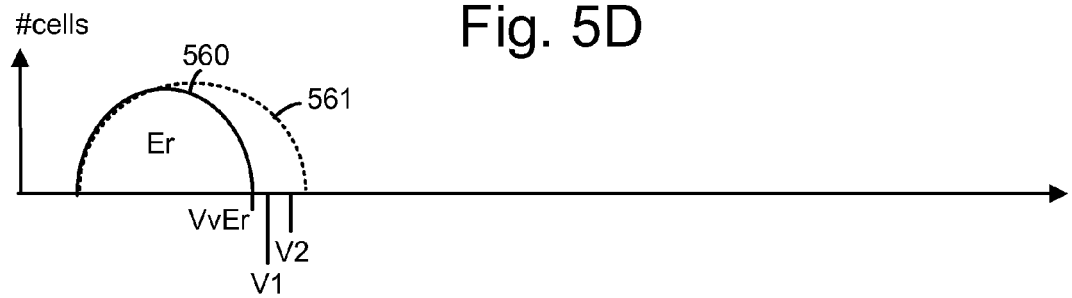
FIG. 5D depicts a threshold voltage (Vth) distribution of erased state memory cells which are subject to inadvertent programming.

FIG. 5D depicts a threshold voltage (Vth) distribution of erased state memory cells which are subject to inadvertent programming. In some cases, memory cells which are not intended to be programmed can inadvertently be programmed. This is most likely for erased state memory cells. For example, when programming memory cells of a selected word line WLn, the memory cells on the adjacent word lines, WLn+1 may experience inadvertent programming. The memory cells of WLn+1 are normally in the erased state during programming of WLn due to a word line programming order which proceeds one word line at a time starting at WL0. According, it may be desired to periodically read the erased state cells to determine the extent of the inadvertent programming. In some cases, a corrective action may be taken if the inadvertent programming is too great, such as terminating programming of the block, or slowing down the programming on WLn to reduce the amount of inadvertent programming. Or, the amount of inadvertent programming may be tracked over time by a controller as a measure of the health of the memory device.

The Vth distribution 560 represents erased state memory cells before inadvertent programming. The Vth distribution 561 represents erased state memory cells after inadvertent programming, where there is an increase in the upper tail of the Vth distribution. Read operations at voltages of V1 and V2, for example, can be used to measure the number of memory cells with a Vth above V1 or V2, respectively. A corrective action may be taken depending on whether a number of memory cells with Vth>V1 exceeds a threshold, or whether a number of memory cells with Vth>V2 exceeds a threshold, for instance. V2 could be set to VrEr/A, so that a number of memory cells with Vth>V2 represents a number of erased state memory cells which could be read incorrectly as being in the A data state. The number of memory cells with Vth>V1 can provide an early warning of inadvertent programming.

In the example where the memory cells on a word line have not yet been programmed, it is known they are in the erased state. Accordingly, it is sufficient to sample the memory cells to evaluate the erased state Vth distribution. For example, a first half of the memory cells can be read at V1 and the second half can be read at V2. One option is for the cells of the first and second halves to alternate with one another along the word line. Another option is for the cells of the first half to form a first contiguous set of cells, and for the cells of the second half to form a second contiguous set of cells. The sense circuit controller can be configured to know which cells are to be read at V1 and which are to be read at V2 based on the respective positions of the memory cells along the word line. As an example, assume the read operation at V1 determines that 10% of the memory cells which are read at V1 have Vth>V1, and the read operation at V2 determines that 5% of the memory cells which are read at V2 have Vth>V2.

Figure 6A:
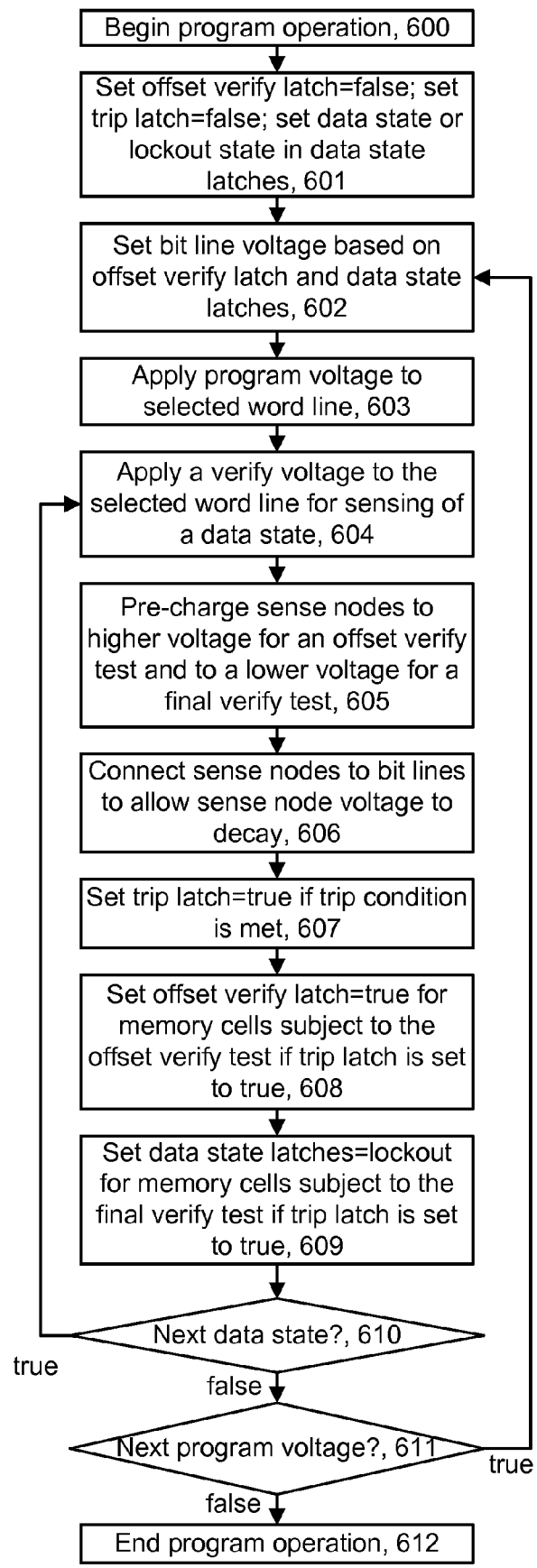
FIG. 6A depicts a flowchart of an example program operation in which sensing occurs for offset and final verify voltages in a single verify operation.
Figure 7A:
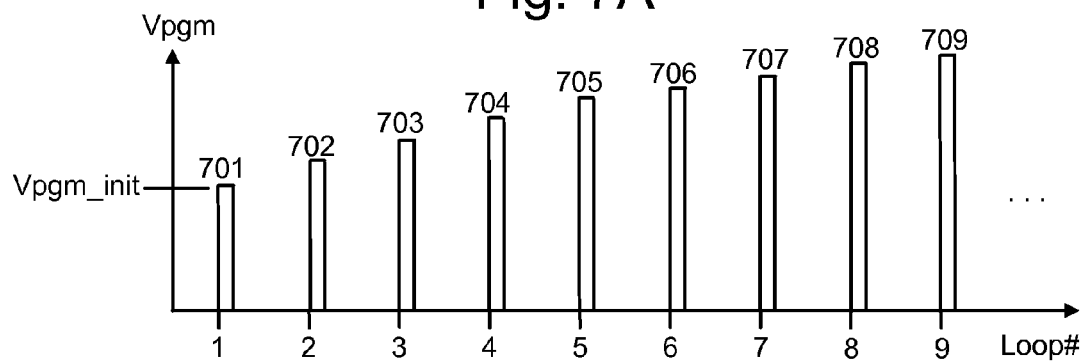
FIG. 7A depicts a set of program voltages in a program operation, consistent with step 603 of FIG. 6A.
Figure 7B:
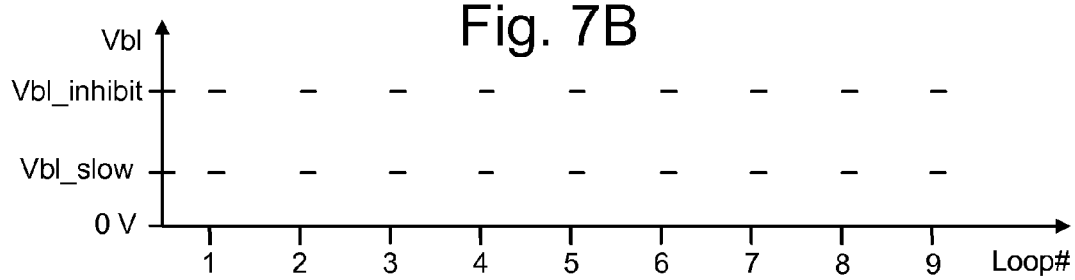
FIG. 7B depicts bit lines voltages which can be used during the program voltages of FIG. 7A, consistent with step 602 of FIG. 6A.
Figure 7C:
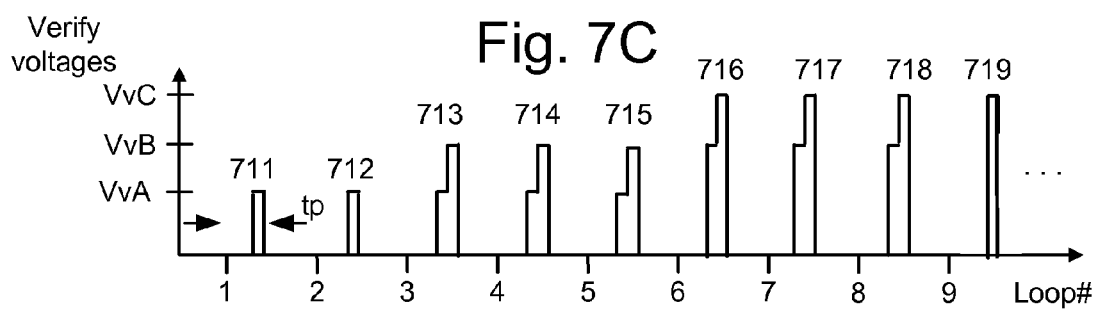
FIG. 7C depicts verify voltages which can be used between the program voltages of FIG. 7A, consistent with step 604 of FIG. 6A, where a single verify voltage is used for each data state to perform verify tests at the offset and final verify voltages for each data state.

FIG. 6A depicts a flowchart of an example program operation in which sensing occurs for offset and final verify voltages of a data state in a single verify operation. This example is consistent with FIGS. 5A and 5B. Refer also to FIG. 7A-7C and to the latches 826-828 and 846-848 of FIG. 8B. Step 600 begins a program operation. Step 601 includes setting an offset verify latch (e.g., latches 827 and 847) =false, and setting a trip latch (e.g., latches 826 and 846) =false for all sense circuits. A determination can be made that a memory cell has a threshold voltage below a demarcation voltage such as an offset verify voltage of a data state when offset verify latch=false. A determination can be made that a memory cell has a threshold voltage above a demarcation voltage such as the offset verify voltage when offset verify latch=true.

A lockout state is set in the data state latches for the sense circuits of memory cells which are to remain in the erased state. For the sense circuits of memory cells which are to be programmed to a particular data state, the data state latches are set to identify the particular data state. Step 602 includes setting a bit line voltage based on the offset verify latch and the data state latches. As mentioned, an elevated Vbl can be set during a program voltage for a memory cell with VO<Vth<VF to slow the rate of programming. A memory cell has VO<Vth<VF if the offset verify latch=true and the data state latches indicate the memory cell is not in a lockout state. Vbl=0 V can be set during a program voltage for a memory cell with Vth<VO to allow a fast rate of programming. Vbl can be set to a relatively high lockout voltage during a program voltage for a memory cell which is in the lockout state.

Step 603 involves applying a program voltage to a selected word line. For example, see the program voltages of FIG. 7A. Step 604 involves applying a verify voltage to the selected word line for sensing of a data state. For example, see the verify voltages of FIG. 7C. Step 605 involves pre-charging sense nodes of the sense circuits to a relatively higher voltage for an offset verify test and to a relatively lower voltage for a final verify test. Further details are provided, e.g., in connection with FIG. 8B-13. For example, a sense node which is associated with a memory cell which is to be verified at an offset verify voltage can be pre-charged to a relatively higher voltage (e.g., a first sense node voltage), while a sense node which is associated with a memory cell which is to be verified at a verify high voltage can be pre-charged to a relatively lower voltage (e.g., a second sense node voltage). A sense node which is associated with a memory cell which is in the locked out state can be pre-charged to the relatively higher voltage or the relatively lower voltage, or not pre-charged. After the pre-charge voltage is set at a sense node, step 606 includes connecting the sense nodes to the bit lines to allow the sense node voltage to decay/discharge. For example, while a control gate voltage is applied to the first memory cell and the second memory cell, the first sense node voltage and the second sense node voltage are allowed to discharge in a discharge period.

The connecting can involve causing a transistor to transition from a non-conductive state to a conductive state, where the transistor is between the sense node and the bit line. Step 607 includes setting the trip latch based on whether a trip condition is met, e.g., the sense node voltage has decayed below a trip voltage at a sense time. The trip latch is set to true if the trip condition is met, e.g., the sense node voltage has not decayed below the trip voltage at the sense time. The trip latch remains set to false if the trip condition is not met, e.g., the sense node voltage has decayed below the trip voltage at the sense time. Step 608 sets the offset verify latch=true for memory cells subject to the offset verify test if the trip latch is set to true, indicating the Vth exceeds the offset verify voltage. In one approach, the controller reads the trip latch of a sense circuit and provides a command to the sense circuit to set the offset verify latch. Step 609 includes setting the data state latches=lockout for memory cells subject to the final verify test if the trip latch is set to true, indicating Vth exceeds the final verify voltage. In one approach, the controller reads the trip latch of a sense circuit and provides a command to the sense circuit to set the data state latches.

A decision step 610 determines whether there is a next data state which is subject to a verify test. If decision step 610 is true, the process continues at step 604, where a next verify voltage is applied to the selected word line. In the example of FIG. 7B, VvA is the only verify voltage in program loops 1 and 2, VvA and VvB are verify voltages in program loops 3-5 and VvB and VvC are verify voltages in program loops 6-9. If decision step 610 is false, a decision step 611 determines whether there is a next program voltage to apply in the program operation. Typically, a next program voltage is applied until all, or nearly all, of the memory cells which are being programmed have passed the verify test at the final verify voltage. However, a fail status may be set for the program operation if a maximum allowable number of program voltages have been applied before all, or nearly all, of the memory cells which are being programmed have passed the verify test at the final verify voltage.

If decision step 611 is true, the process continues at step 602 where the bit line voltage is set and another program voltage is applied. If decision step 611 is false, the program operation ends at step 612.

Figure 6B:
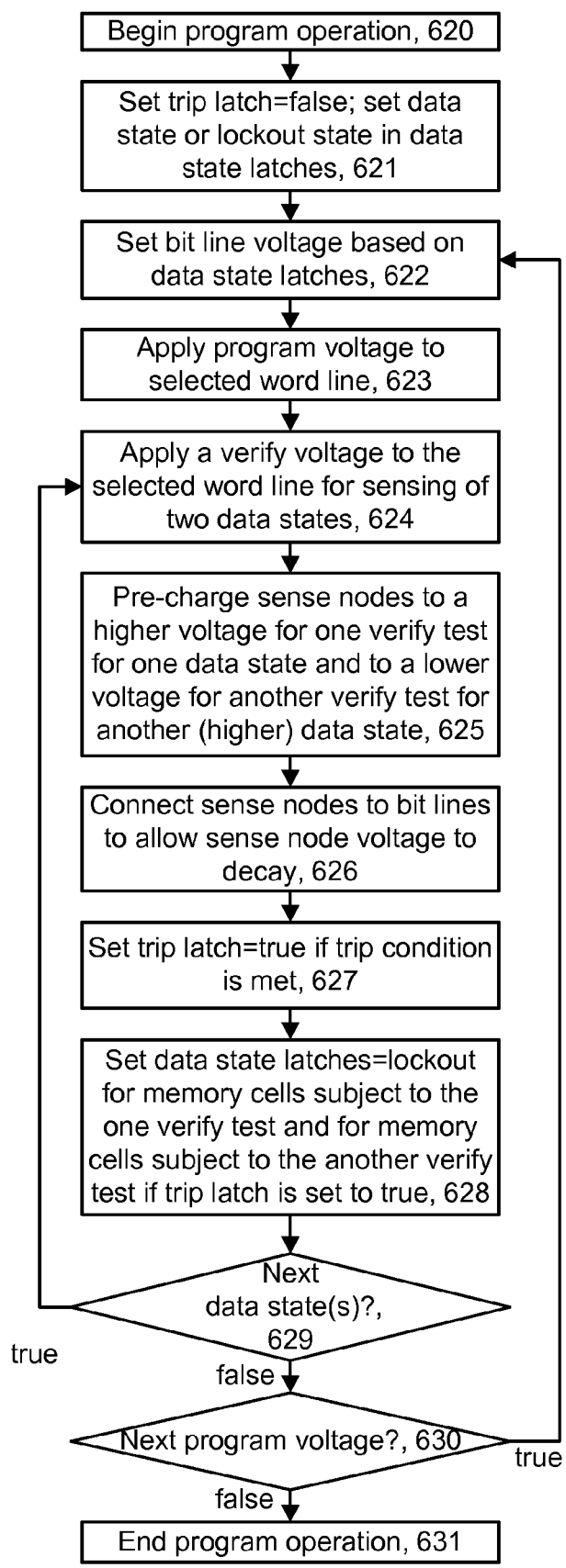
FIG. 6B depicts a flowchart of an example program operation in which sensing occurs for verify voltages of multiple data states in a single verify operation.

FIG. 6B depicts a flowchart of an example program operation in which sensing occurs for verify voltages of multiple data states in a single verify operation. This example is consistent with FIG. 5C. Refer also to FIGS. 7E and 7F and to the latches 826-828 and 846-848 of FIG. 8B. Step 620 begins a program operation. Step 621 includes setting a trip latch=false for all sense circuits. A lockout state is set in the data state latches for the sense circuits of memory cells which are to remain in the erased state. For the sense circuits of memory cells which are to be programmed to a particular data state, the data state latches are set to identify the particular data state. Step 622 includes setting a bit line voltage based on the data state latches.

Step 623 involves applying a program voltage to a selected word line. For example, see the program voltages of FIG. 7E. Step 624 involves applying a voltage to the selected word line for sensing of multiple data states such as two adjacent data states. For example, see the verify voltages of FIG. 7F. Step 625 involves pre-charging sense nodes of the sense circuits to a relatively higher voltage for one verify test for the one (lower) data state and to a relatively lower voltage for another verify test for the another (higher) data state. For example, a sense node of a memory cell which is to be verified at a verify voltage of the A data state can be pre-charged to a relatively higher voltage, while a sense node of a memory cell which is to be verified at a verify voltage of the B data state can be pre-charged to a relatively lower voltage.

After the pre-charge voltage is set at a sense node, step 626 includes connecting the sense nodes to the bit lines to allow the sense node voltage to decay. Step 627 includes setting the trip latch based on whether a trip condition is met. Step 628 sets the data state latches=lockout for memory cells subject to the one verify test and for memory cells subject to the another verify test if the trip latch is set to true, indicating Vth exceeds the associated verify voltage.

A decision step 629 determines whether there is a next data state which is subject to a verify test. If decision step 629 is true, the process continues at step 624, where a next verify voltage is applied to the selected word line. If decision step 629 is false, a decision step 630 determines whether there is a next program voltage to apply in the program operation. If decision step 630 is true, the process continues at step 622 where the bit line voltage is set and another program voltage is applied. If decision step 630 is false, the program operation ends at step 631.

FIG. 7A depicts a set of program voltages in a program operation, consistent with step 603 of FIG. 6A. The vertical axis depicts Vpgm, a control gate or word line voltage, and the horizontal axis depicts time or program loop number (e.g., program-verify iteration number). A one pass program operation with four data states is depicted in FIG. 7A-7D. Other options are possible. The program operation comprises a series of program voltages 701-709. Incremental step pulse programming is performed, such that Vpgm begins at an initial level, Vpgm_init and increases step-wise in each program loop. This example also performs verify tests based on the program loop (see FIGS. 7C and 7DE).

For example, the A data state cells are verified in loops 1 and 2, the A and B data state cells are verified in loops 3-5, the B and C data state cells are verified in loops 6-8 and the C data state cells are verified in loop 9. The horizontal axes of FIG. 7A-7D are time-aligned.

FIG. 7B depicts bit lines voltages which can be used during the program voltages of FIG. 7A, consistent with step 602 of FIG. 6A. Each short horizontal line represents a bit line voltage which can be applied during a corresponding program voltage for a given memory cell. For example, Vbl_inhibit may be applied to the bit lines for the memory cells with a lockout status (e.g., the erased state cells or the memory cells which have completed programming to a data state). Vbl_slow (a positive voltage) may be applied to the memory cells which are subject to a slow program speed since VO<Vth<VF. Vbl=0 V may be set for the cells for which Vth<VO.

FIG. 7C depicts verify voltages which can be used between the program voltages of FIG. 7A, consistent with step 604 of FIG. 6A, where a single verify voltage is used for each data state to perform verify tests at the offset and final verify voltages for each data state. Waveforms 711 and 712 in program loops 1 and 2, respectively, have a magnitude of VvA. Waveforms 713, 714 and 715 in program loops 3, 4 and 5, respectively, have a magnitude of VvA and VvB. Waveforms 716, 717 and 718 in program loops 6, 7 and 8, respectively, have a magnitude of VvB and VvC. Waveform 719 in program loop 9 has a magnitude of VvC. Advantageously, two (or more) verify tests can be performed for the memory cells of a selected word line while one control gate voltage is applied to the word line. For example, in program loops 1 and 2, verify tests at VvAO and VvA can be performed for the A data state cells using the control gate voltage of VvA. In program loops 3, 4 and 5, verify tests at VvAO and VvA can be performed for the A data state cells using the control gate voltage of VvA, and verify tests at VvBO and VvB can be performed for the B data state cells using the control gate voltage of VvB. The control gate voltage could alternatively be a voltage other than VvA or VvAO.

In program loops 6, 7 and 8, verify tests at VvBO and VvB can be performed for the B data state cells using the control gate voltage of VvB, and verify tests at VvCO and VvC can be performed for the C data state cells using the control gate voltage of VvC. In program loop 9, verify tests at VvCO and VvC can be performed for the C data state cells using the control gate voltage of VvC.

The time period tp in FIG. 7C is depicted in greater detail in FIG. 10A.

Figure 7D:
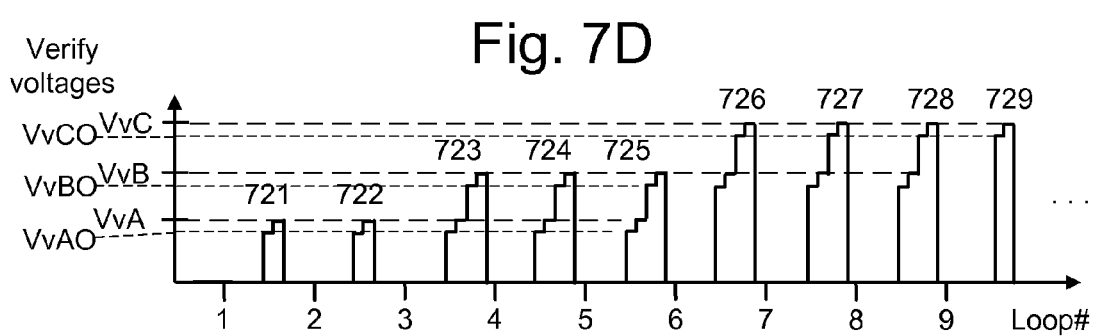
FIG. 7D depicts verify voltages which can be used between the program voltages of FIG. 7A, where multiple verify voltages are used for each data state to perform verify tests at the offset and final verify voltages for each data state.
Figure 7E:
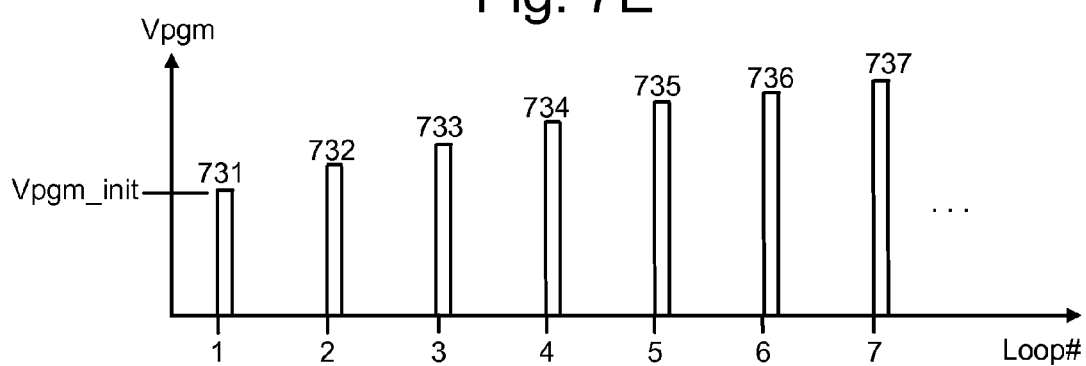
FIG. 7E depicts a set of program voltages in a program operation, consistent with step 623 of FIG. 6B.
Figure 7F:
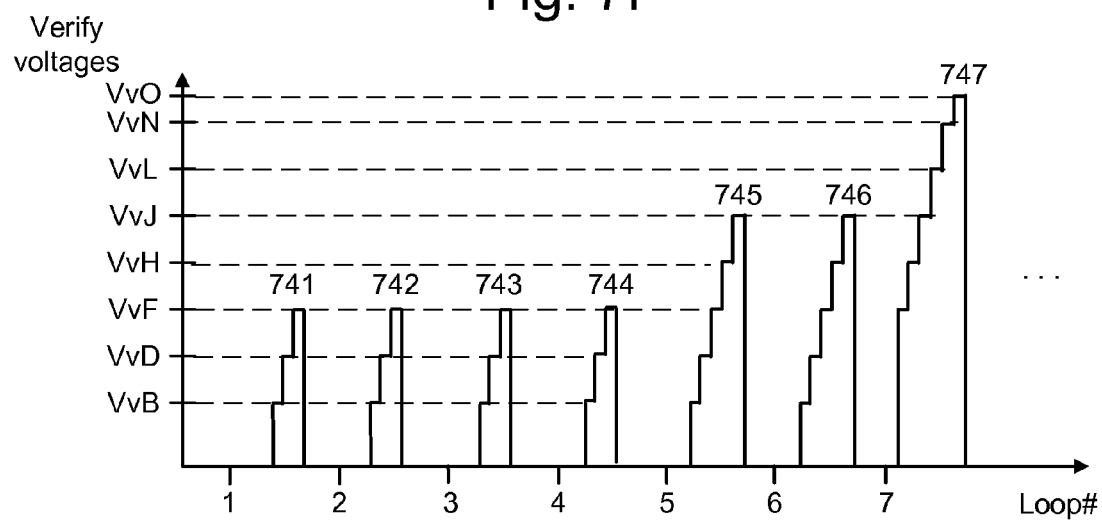
FIG. 7F depicts verify voltages which can be used between the program voltages of FIG. 7E, consistent with step 624 of FIG. 6B, where a single verify voltage is used for adjacent data states.

FIG. 7D depicts verify voltages which can be used between the program voltages of FIG. 7A, where multiple verify voltages are used for each data state to perform verify tests at the offset and final verify voltages for each data state. This provides a comparative example relative to FIG. 7C. This approach results in an increased program time due to the time needed to apply separate control gate voltages to the selected word line for each verify test. Waveforms 721 and 722 in program loops 1 and 2, respectively, have magnitudes of VvAO and VvA. Waveforms 723, 724 and 725 in program loops 3, 4 and 5, respectively, have magnitudes of VvAO, VvA, VvBO and VvB. Waveforms 726, 727 and 728 in program loops 6, 7 and 8, respectively, have magnitudes of VvBO, VvB, VvCO and VvC. Waveform 729 in program loop 9 has magnitudes of VvCO and VvC.

FIG. 7E depicts a set of program voltages in a program operation, consistent with step 623 of FIG. 6B. The vertical axis depicts Vpgm, a control gate or word line voltage, and the horizontal axis depicts time or program loop number (e.g., program-verify iteration number). A one pass program operation with sixteen data states is depicted in FIGS. 7E and 7F. The program operation comprises a series of program voltages 731-737. This example also performs verify tests based on the program loop (see FIG. 7F). The horizontal axes of FIGS. 7E and 7F are time-aligned.

FIG. 7F depicts verify voltages which can be used between the program voltages of FIG. 7E, consistent with step 624 of FIG. 6B, where a single verify voltage is used for adjacent data states. The vertical axis is expanded relative to FIG. 7E to show details.

Waveforms 741, 742, 743 and 744 in program loops 1, 2, 3 and 4, respectively, have a magnitude of VvB, VvD and VvF. Waveforms 745 and 746 in program loops 5 and 6, respectively, have the magnitudes of VvB, VvD, VvF, VvH and VvJ. Waveform 747 in program loop 7 has the magnitudes of VvF, VvH, VvJ, VvL, VvN and VvO.

Advantageously, as discussed, verify tests for two (or more) data states can be performed for the memory cells of a selected word line while one control gate voltage is applied to the word line. For example, in program loops 1-6, verify tests at VvA and VvB can be performed for the A and B data state cells, respectively, using the control gate voltage of VvB; verify tests at VvC and VvD can be performed for the C and D data state cells, respectively, using the control gate voltage of VvD; and verify tests at VvE and VvF can be performed for the E and F data state cells, respectively, using the control gate voltage of VvF.

In program loops 5 and 6, additional verify tests at VvG and VvH can be performed for the G and H data state cells, respectively, using the control gate voltage of VvH; and verify tests at VvI and VvJ can be performed for the I and J data state cells, respectively, using the control gate voltage of VvJ.

In program loop 7, verify tests at VvB and VvD may no longer be performed, assuming programming has completed for the A, B, C and D states. Verify tests at VvE and VvF can be performed for the E and F data state cells, respectively, using the control gate voltage of VvF; verify tests at VvG and VvH can be performed for the G and H data state cells, respectively, using the control gate voltage of VvH; verify tests at VvI and VvJ can be performed for the I and J data state cells, respectively, using the control gate voltage of VvJ; verify tests at VvK and VvL can be performed for the K and L data state cells, respectively, using the control gate voltage of VvL; verify tests at VvM and VvN can be performed for the M and N state cells, respectively, using the control gate voltage of VvN; and a verify test at VvO can be performed for the O data state cells using the control gate voltage of VvO.

Figure 8B:
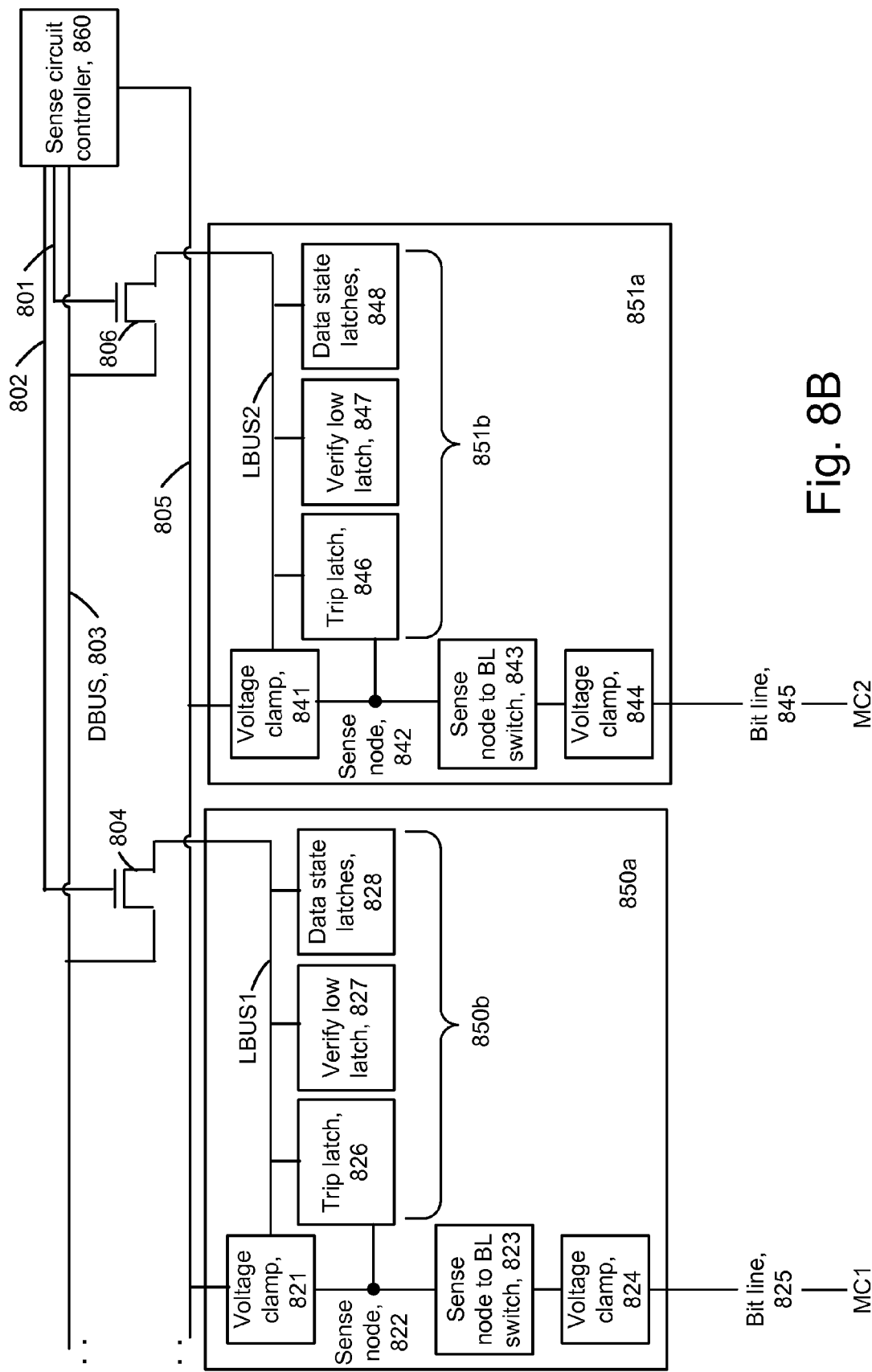
FIG. 8B depicts another example block diagram of the sense block SB1 of FIG. 1.

FIG. 8A depicts an example block diagram of the sense block SB1 of FIG. 1. In one approach, a sense block comprises multiple sense circuits. Each sense circuit is associated with data latches. For example, the example sense circuits 850a, 851a, 852a and 853a are associated with the data latches 850b, 851b, 852b and 853b, respectively. In one approach, different subsets of bit lines can be sensed using different respective sense blocks. This allows the processing load which is associated with the sense circuits to be divided up and handled by a respective processor in each sense block. For example, a sense circuit controller 860 in SB1 can communicate with the set of sense circuits and latches. The sense circuit controller may include a pre-charge circuit 861 which provides a voltage to each sense circuit for setting a pre-charge voltage. In one possible approach, the voltage is provided to each sense circuit independently, e.g., via the data base 803 and a local bus such as LBUS1 or LBUS2 in FIG. 8B. In another possible approach, a common voltage is provided to each sense circuit concurrently, e.g., via the line 805 in FIG. 8B. The sense circuit controller may also include a memory 862 and a processor 863. As mentioned also in connection with FIG. 2, the memory 862 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 850a and 851a are provided below.

FIG. 8B depicts another example block diagram of the sense block SB1 of FIG. 1. The sense circuit controller 860 communicates with multiple sense circuits including example sense circuits 850a and 851a, also shown in FIG. 8A. The sense circuit 850a includes latches 850b, including a trip latch 826, an offset verify latch 827 and data state latches 828. The sense circuit further includes a voltage clamp 821 such as a transistor which sets a pre-charge voltage at a sense node 822. A sense node to bit line (BL) switch 823 selectively allows the sense node to communicate with a bit line 825, e.g., the sense node is electrically connected to the bit line so that the sense node voltage can decay. The bit line 825 is connected to one or more memory cells such as a memory cell MC1. A voltage clamp 824 can set a voltage on the bit line, such as during a sensing operation or during a program voltage. A local bus, LBUS1, allows the sense circuit controller to communicate with components in the sense circuit, such as the latches 850b and the voltage clamp in some cases. To communicate with the sense circuit 850a, the sense circuit controller provides a voltage via a line 802 to a transistor 804 to connect LBUS1 with a data bus DBUS, 803. The communicating can include sending data to the sense circuit and/or receive data from the sense circuit.

The sense circuit controller can communicate with different sense circuits in a time-multiplexed manner, for instance. A line 805 may be connected to the voltage clamp in each sense circuit, in one approach.

The sense circuit 851a includes latches 851b, including a trip latch 846, an offset verify latch 847 and data state latches 848. A voltage clamp 841 may be used to set a pre-charge voltage at a sense node 842. A sense node to bit line (BL) switch 843 selectively allows the sense node to communicate with a bit line 845, and a voltage clamp 844 can set a voltage on the bit line. The bit line 845 is connected to one or more memory cells such as a memory cell MC2. A local bus, LBUS2, allows the sense circuit controller to communicate with components in the sense circuit, such as the latches 851b and the voltage clamp in some cases. To communicate with the sense circuit 851a, the sense circuit controller provides a voltage via a line 801 to a transistor 806 to connect LBUS2 with DBUS.

The sense circuit 850a may be a first sense circuit which comprises a first trip latch 826 and the sense circuit 851a may be a second sense circuit which comprises a second trip latch 846.

The sense circuit 850a is an example of a first sense circuit comprising a first sense node 822, where the first sense circuit is associated with a first memory cell MC1 and a first bit line 825. The sense circuit 851a is an example of a second sense circuit comprising a second sense node 842, where the second sense circuit is associated with a second memory cell MC2 and a second bit line 845.

FIG. 8C depicts current sensing based on a change in voltage, in an example implementation of the trip latches of FIG. 8B. Each trip latch can comprise a current sensing module which determines whether the associated memory cell is in a conductive or non-conductive state by the level of current through the cell. Generally, a relatively higher current will flow when the memory cell is in a conductive state and a relatively lower current will flow when the memory cell is in a non-conductive state. A threshold voltage of the memory cell is above or below a compare level, such as a verify voltage or a read voltage, when it is in a non-conductive state or a conductive state, respectively. In one possible approach, the current sensing module determines a voltage drop which is tied to a fixed current flow by the relationship $\Delta V = i \cdot t / C$, where $\Delta V$ is the voltage drop, i is the fixed current, t is a predetermined discharge time period (e.g., ts1-td1) and C is the capacitance of a pre-charged capacitor in the current sensing module. FIG. 8C depicts voltage drop with time for different lines of fixed current. The greater voltage drops represent higher currents. At the end of a given discharge period, in one possible approach, a p-mos transistor is used to determine a voltage of a sense node relative to a reference voltage. In another possible approach, a cell current discriminator serves as a discriminator or comparator of current levels by determining whether the conduction current is higher or lower than a given reference current. The trip latches set a logical output value based on the voltage or current level. The trip latch may have an output of true if the sense node voltage>reference voltage or i<reference current, indicating that a trip condition was met, or an output of false if the sense node voltage<reference voltage or i>reference current, indicating that the trip condition was not met.

In another example implementation of the trip latches, voltage sensing is used. Voltage sensing does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected memory cell is conductive, in which case the voltage of the capacitor in the voltage sensing module does not drop significantly and the trip condition is not met. Charge sharing occurs when the selected memory cell is non-conductive, in which case the voltage of the capacitor in the voltage sensing module does drop significantly and the trip condition is met.

FIG. 9A is a table depicting values of the latches of the sense circuits of FIG. 8B during a program operation. For a memory cell with Vth<VO, the offset verify latch=false and the data state latch=data state. For instance, for a memory cell with the A data state as the data state, if Vth<VvAO, the offset verify latch=false and the data state latch=A data state. A single bit of data can be used to indicate a true or false state. One value or voltage of the bit can indicate "true" (e.g., bit=1) and another value or voltage of the bit can indicate "false" (e.g., bit=0). Moreover, the data state can be indicated by one or more bits. Two bits may identify one of four data states, three bits may identify one of eight data state and so forth. For instance, with four data states, the bit sequence of 11 (a 1 bit in each of two different data state latches) can indicate the erased state and the lockout state. The bit sequences of 01, 00 and 10 can indicate the A, B and C data states, respectively. The bit sequence may be written as the bit of the upper page followed by the bit of the lower page. With eight data states, the bit sequence of 111 can indicate the erased state and the lockout state. The bit sequences of 011, 001, 101, 100, 000, 010 and 110 can indicate the A, B, C, D, E, F and G data states, respectively. The bit sequence may be written as the bit of the upper page followed by the bit of the middle page followed by the bit of the lower page.

For a memory cell with VO<Vth<VF, the offset verify latch=true and the data state latch=data state. For instance, for a memory cell with the A data state as the data state, if VvAO<Vth<VvA, the offset verify latch=true and the data state latch=A data state. For a memory cell with Vth>VF, the offset verify latch=true and the data state latch=lockout. For instance, for a memory cell with the A data state as the data state, if Vth>VvA, the offset verify latch=true and the data state latch=lockout. In this case, the value of the offset verify latch is a "don't care."

FIG. 9B is a table depicting four example cases of pre-charge operations for sense nodes in the sense circuits of FIG. 8B during a program operation, consistent with step 605 of FIG. 6A. The time points t7, t9 and t12 are consistent with those provided in FIG. 10A-10C4, where FIGS. 10C1, 10C2, 10C3 and 10C4 in particular represent cases 1, 2, 3 and 4, respectively. In FIG. 9B, VsenVO represents the pre-charge voltage at the sense node for performing a verify test at an offset verify voltage (VO), and VsenVF represents the pre-charge voltage at the sense node for performing a verify test at a final verify voltage (VF). In one approach, VsenVO>VsenVF so that a common sense time and trip voltage may be used for the VO and VF verify tests which occur concurrently in different sense nodes.

In case 1, for the verify test at VO, the sense node is pre-charged to VsenVO at t7, and there is no change to the sense node voltage at t9 so that the sense node voltage remains at VsenVO. For the verify test at VF, the sense node is not pre-charged at t7 so that it remains at 0 V, and is pre-charged to VsenVF at t9.

In case 2, for the verify test at VO, the sense node is not pre-charged at t7 so that it remains at 0 V, and is pre-charged to VsenVO at t9. For the verify test at VF, the sense node is pre-charged to VsenVF at t7, and there is no change to the sense node voltage at t9 so that the sense node voltage remains at VsenVF.

In case 3, for the verify test at VO, the sense node is pre-charged to VsenVF at t7, and is pre-charged further, from VsenVF to VsenVO at t9. For the verify test at VF, the sense node is pre-charged to VsenVF at t7, and there is no change to the sense node voltage at t9 so that the sense node voltage remains at VsenVF.

In case 4, for the verify test at VO, the sense node is pre-charged to VsenVO at t7, and there is no change to the sense node voltage at t9 and t12 so that the sense node voltage remains at VsenVO. For the verify test at VF, the sense node is pre-charged to VsenVO at t7, discharged to about 0 V at t9 then pre-charged again to VsenVF at t12.

The optimal case for pre-charging can vary based on the configuration of the sense circuit.

FIG. 9C depicts example values in data latches during a program operation, consistent with FIG. 9A. The data latches includes an offset verify latch 900, an upper page latch 901 and a lower page latch 902, and are associated with one memory cell along a selected word line. A bit combination in a set of latches may be written with the lower page bit followed by the upper page bit, followed by the offset verify bit. Er is the erased state, which has the same bit combination (111) as the inhibit/lockout states Ainh, Binh, Cinh. The bits under A, B, and C are for a cell which is to be programmed to the A, B or C data state, respectively, and which has not locked out and is not in the slow programming mode. The bits under Aslow, Bslow and Cslow are for a cell which is to be programmed to the A, B or C data state, respectively, and is in the slow programming mode (and thus not locked out).

For example, during programming, the latches of an A data state cell would transition from 100 to 101 to 111, the latches of a B data state cell would transition from 000 to 001 to 111, and the latches of a C data state cell would transition from 010 to 011 to 111.

In FIG. 10A-10C4, the vertical axis depicts a voltage and the horizontal axis depicts time. Moreover, the horizontal axes are time-aligned. A time period t0415 corresponds to the time period tp of FIG. 7C and represents a program-verify iteration. The program-verify iteration includes a time period tp1 (t1-t6) in which a program voltage is applied to a selected word line, and a time period tp2 (t7-t15) in which a verify operation is performed. In this example, the verify operation includes a verify test at an offset verify voltage of VvAO and a verify test at a final verify voltage of VvA.

FIG. 10A depicts an example bit line voltage in a time period tp, consistent with FIG. 7A-7C. The vertical axis depicts the bit line voltage, Vbl. From t1-t6, Vbl is set to an elevated level of Vbl_slow for a cell which is in the slow programming mode (e.g., with VvAO<Vth<VvA), as represented by a plot 1000a or at 0 V for a cell which is in the fast programming mode (e.g., with Vth<VvAO), as represented by a plot 1000b. Vbl is set to a lockout level of Vbl_inhibit (plot 1000c) for a cell which is in the lockout mode.

From t7-t15, the bit line is pre-charged to a desired level to allow a current to flow in the selected memory cell and the associated NAND string without discharging the sense node too quickly. The pre-charging of the bit line is different than the pre-charging of the sense node. The bit line may be pre-charged to a level Vbl_pc as depicted by a plot 1001.

FIG. 10B depicts an example selected word line voltage in a time period tp, consistent with FIG. 7A-7C. The program voltage may step up initially from 0 V to a level Vpass at t2-t3, which is the voltage applied to the unselected word lines. The program voltage then steps up further at t3-t4 to Vpgm. The program voltage then steps down at t5 from Vpgm to 0 V. The final verify voltage is applied to the selected word line from t7-t15, consistent with FIG. 7C. In this example, VvA is applied.

FIG. 10C1 depicts an example sense node voltage in a time period tp, consistent with FIG. 7A-7C and the pre-charging case 1 of FIG. 9D. A first pre-charge process begins at t7. In particular, the sense node is pre-charged from 0 V to VsenVO at t7-t8 (plot 1010) and remains at VsenVO from t8-td1. At td1, the sense node is electrically connected to the bit line so that the sense node voltage can decay. A plot 1010a indicates a relatively small amount of decay, to a voltage which is above a trip voltage Vtrip at a sense time ts1. This indicates Vth>VvAO. A plot 1010b indicates a relatively large amount of decay, to a voltage which is below Vtrip at ts1. This indicates Vth<VvAO.

A second pre-charge process begins at t9. In particular, the sense node is pre-charged from 0 V to VsenHL at t9-t10 (plot 1012) and remains at VsenHL from t10-td1. At td1, the sense node is electrically connected to the bit line so that the sense node voltage can decay. A plot 1012a indicates a relatively small amount of decay, to a voltage which is above Vtrip at ts1. This indicates Vth>VvA. A plot 1012b indicates a relatively large amount of decay, to a voltage which is below Vtrip at ts1. This indicates Vth<VvA.

In each of the four cases, some sense nodes have a pre-charge voltage of VsenVO while others have a pre-charge voltage of VsenVF, at the start of the decay period at td1.

As mentioned, the magnitude of VsenVO and VsenVF may be set so that a common discharge period and trip voltage are used in the sense circuits which are pre-charged to these different voltages. The current-voltage (I-V) curve of a memory cell can be used to set the voltages.

FIG. 10C2 depicts an example sense node voltage in a time period tp, consistent with FIG. 7A-7C and the pre-charging case 2 of FIG. 9D. A first pre-charge process begins at t7. In particular, the sense node is pre-charged from 0 V to VsenVF at t7-t8 (plot 1020) and remains at VsenVF from t8-td1. At td1, the sense node is electrically connected to the bit line so that the sense node voltage can decay. A plot 1020a indicates a relatively small amount of decay, to a voltage which is above Vtrip at ts1. This indicates Vth>VvA. A plot 1020b indicates a relatively large amount of decay, to a voltage which is below Vtrip at ts1. This indicates Vth<VvA.

A second pre-charge process begins at t9. In particular, the sense node is pre-charged from 0 V to VsenVO at t9-t10 (plot 1022) and remains at VsenVO from t10-td1. At td1, the sense node is electrically connected to the bit line so that the sense node voltage can decay. A plot 1022a indicates a relatively small amount of decay, to a voltage which is above Vtrip at ts1. This indicates Vth>VvAO. A plot 1022b indicates a relatively large amount of decay, to a voltage which is below Vtrip at ts1. This indicates Vth<VvAO.

FIG. 10C3 depicts an example sense node voltage in a time period tp, consistent with FIG. 7A-7C and the pre-charging case 3 of FIG. 9D. A first pre-charge process begins at t7. In particular, the sense node is pre-charged from 0 V to VsenVF at t7-t8 (plot 1030) and remains at VsenVF from t8-td1 (plot 1030c). At td1, the sense node is electrically connected to the bit line so that the sense node voltage can decay. A plot 1030a indicates a relatively small amount of decay, to a voltage which is above Vtrip at ts1. This indicates Vth>VvA. A plot 1030b indicates a relatively large amount of decay, to a voltage which is below Vtrip at ts1. This indicates Vth<VvA.

A second pre-charge process begins at t9. In particular, the sense node is pre-charged from VsenVF to VsenVO at t9 (plot 1032) and remains at VsenVO until td1. At td1, the sense node is electrically connected to the bit line so that the sense node voltage can decay. A plot 1032a indicates a relatively small amount of decay, to a voltage which is above Vtrip at ts1. This indicates Vth>VvAO. A plot 1032b indicates a relatively large amount of decay, to a voltage which is below Vtrip at ts1. This indicates Vth<VvAO.

FIG. 10C4 depicts an example sense node voltage in a time period tp, consistent with FIG. 7A-7C and the pre-charging case 4 of FIG. 9D. A first pre-charge process begins at t7. In particular, the sense node is pre-charged from 0 V to VsenVO at t7-t8 (plot 1040) and remains at VsenVO from t8-td1 (plot 1040c). At td2, the sense node is electrically connected to the bit line so that the sense node voltage can decay. A plot 1040a indicates a relatively small amount of decay, to a voltage which is above Vtrip at ts1. Vtrip is indicated by the long dashed line. This indicates Vth>VvAO. A plot 1040b indicates a relatively large amount of decay, to a voltage which is below Vtrip at ts1. This indicates Vth<VvA.

A second pre-charge process also begins at t7. In particular, the sense node is pre-charged from 0 V to VsenVO at t7-t8 (plot 1040). However, in this process, the sense node is discharged from VsenVO back to 0 V at t9 (plot 1042c) and remains at 0 V until t12. The sense node is then pre-charged from 0 V to VsenVF at t12 (plot 1042d) and remains at VsenVF until td2. At td2, the sense node is electrically connected to the bit line so that the sense node voltage can decay. A plot 1042a indicates a relatively small amount of decay, to a voltage which is above Vtrip at a sense time ts2. This indicates Vth>VvAO. A plot 1042b indicates a relatively large amount of decay, to a voltage which is below Vtrip at ts2. This indicates Vth<VvA.

Figure 11A:
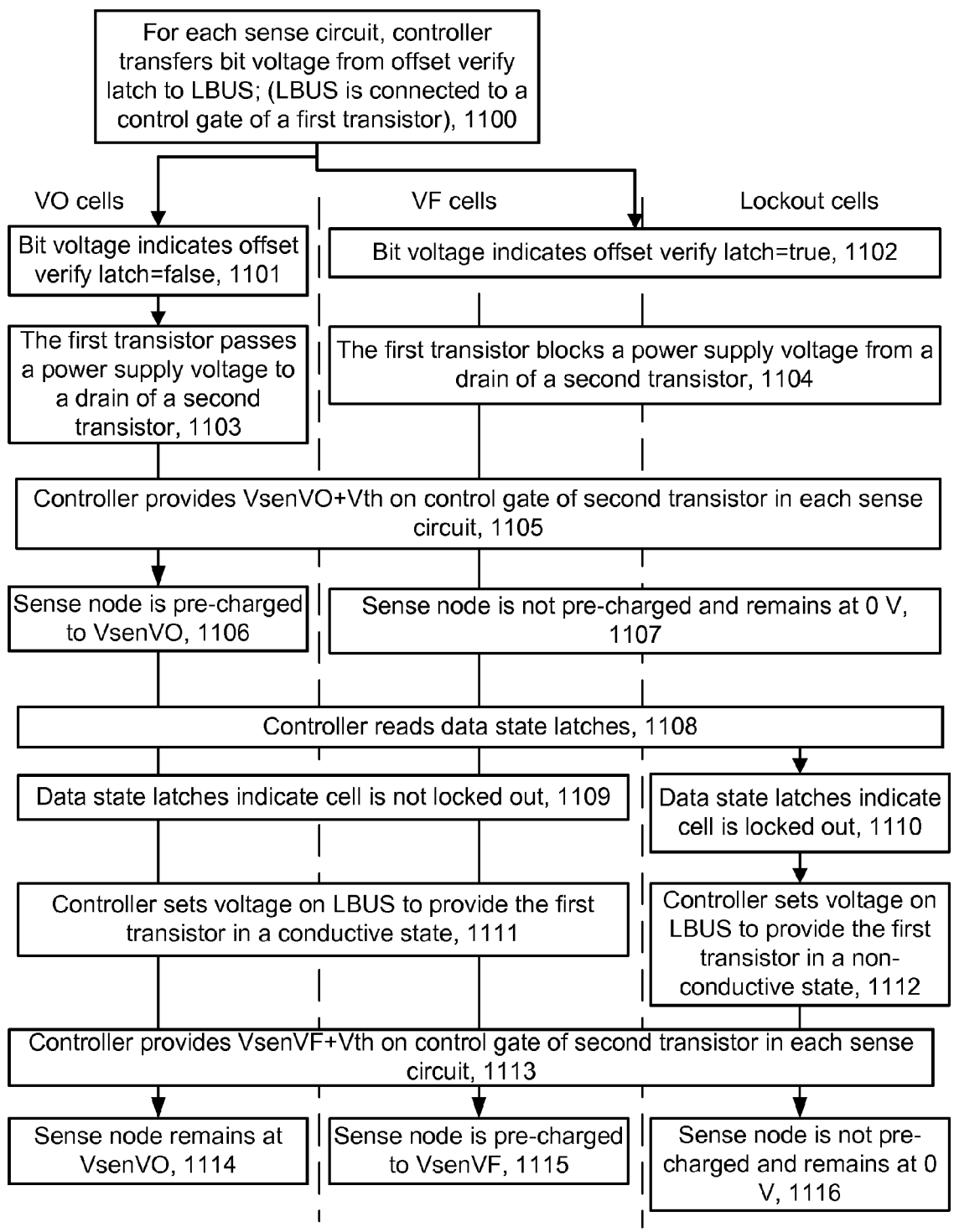
FIG. 11A depicts a flowchart of an example process for implementing the pre-charging case 1 of FIG. 9D.

FIG. 11A depicts a flowchart of an example process for implementing the pre-charging case 1 of FIG. 9D. Refer also to FIGS. 8B, 10C1 and 12A. At step 1100, for each sense circuit, the sense circuit controller transfers a bit voltage from the offset verify latch to LBUS, where LBUS is connected to a control gate of a first transistor. For example, the controller may provide a voltage to the transistor 1202 or 1206 in FIG. 12A which causes the bit voltage to be provided on LBUS. Subsequently, one of three processes is followed depending on whether the memory cell which is being sensed by the sense circuit is a VO cell (a cell with Vth<VO which is subject to an offset verify test), a VF cell (a cell with VO<Vth<VF which is subject to a verify high test) or a lockout cell (a cell with Vth>VF which need not be subject to a verify test). Each process is represented by the steps within a vertical column separated by vertical dashed lines in FIG. 11A-11D.

For the VO cells, the bit voltage indicates that offset verify latch=false (step 1101). For the VF cells and the lockout cells, the bit voltage indicates that offset verify latch=true (step 1102). For the VO cells, the first transistor (e.g., transistor 1236 in FIG. 12A) passes a power supply voltage (Vdd) to the drain 1237 of a second transistor 1238 (step 1103). That is, the bit voltage on the control gate of the first transistor provides the first transistor in a conductive state, so that Vdd at the drain of the first transistor can pass to the drain 1237 of the second transistor. For the VF cells and the lockout cells, the first transistor blocks the power supply voltage from reaching the drain of the second transistor (step 1104). That is, the bit voltage on the control gate of the first transistor provides the first transistor in a non-conductive state, so that Vdd at the drain of the first transistor cannot pass to the drain of the second transistor. At step 1105, the controller provides VsenVO+Vth on the control gate of the second transistor in each sense circuit.

At step 1106, for the VO cells, the sense node is pre-charged to VsenVO. At step 1107, for the VF cells and the lockout cells, the sense node is not pre-charged and remains at 0 V. At step 1108, the controller reads the data state latches, for the VO cells, the VF cells and the lockout cells. At step 1109, the data state latches indicate the cell is not locked out, for the VO cells and the VF cells. At step 1110, the data state latches indicate the cell is locked out, for the locked out cells. At step 1111, the controller sets a voltage on LBUS to provide the first transistor in a conductive state, for the VO cells and the VF cells. At step 1112, the controller sets a voltage on LBUS to provide the first transistor in a non-conductive state, for the locked out cells. At step 1113, the controller provides VsenVF+Vth on the control gate of the second transistor in each sense circuit. At step 1114, the sense node remains at VsenVO for the VO cells because VsenVO>VsenHL. At step 1115, the sense node is pre-charged to VsenVF for the VF cells. At step 1116, the sense node is not pre-charged and remains at 0 V. Optionally, it is possible to pre-charge the sense circuits of the locked out cells since any sensing result is not used for these cells.

However, avoiding a pre-charge of the sense circuits of the locked out cells can reduce power consumption.

Figure 11B:
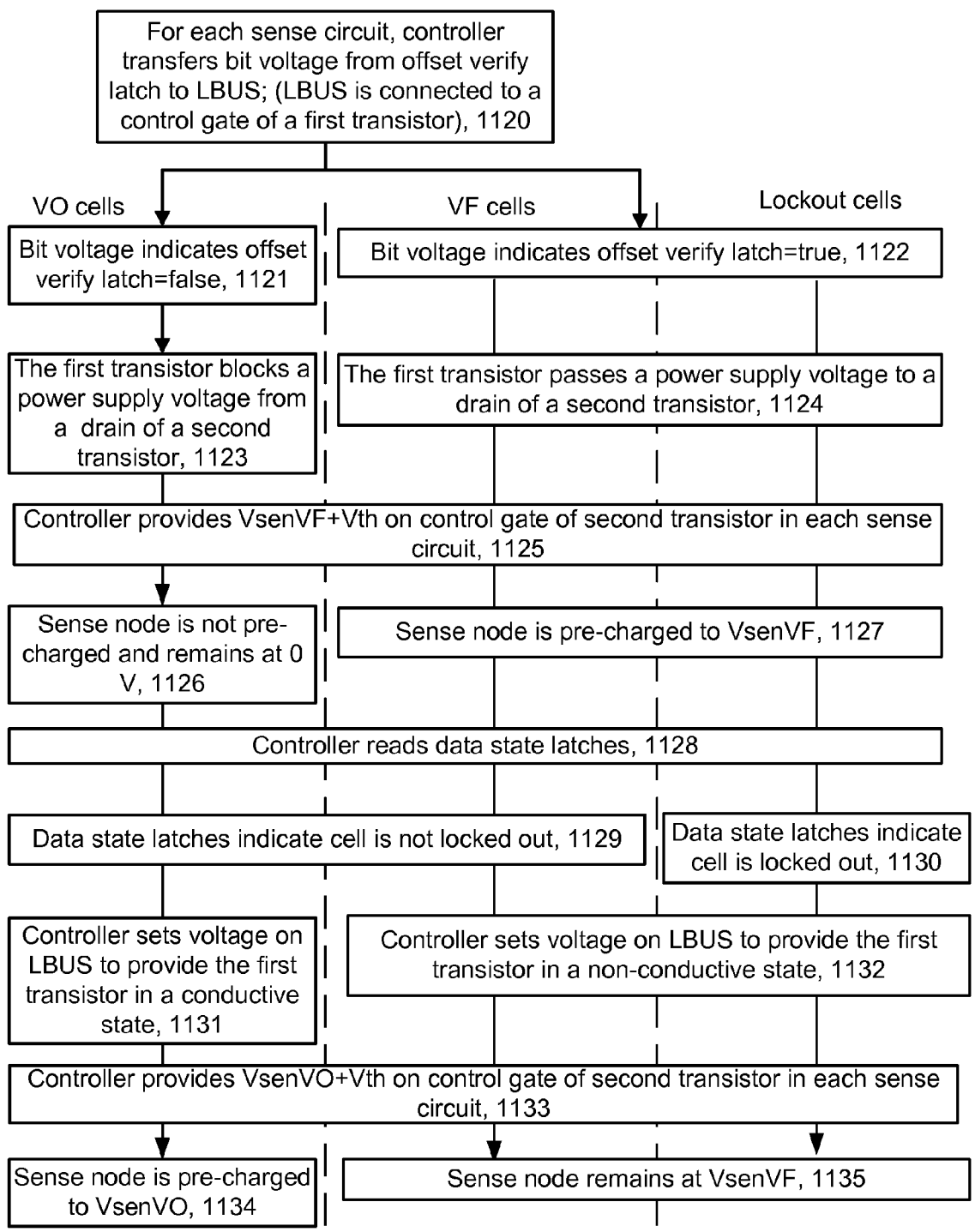
FIG. 11B depicts a flowchart of an example process for implementing the pre-charging case 2 of FIG. 9D.

FIG. 11B depicts a flowchart of an example process for implementing the pre-charging case 2 of FIG. 9D. Refer also to FIGS. 8B, 10C2 and 12A. At step 1120, for each sense circuit, the sense circuit controller transfers a bit voltage from the offset verify latch to LBUS, where LBUS is connected to a control gate of a first transistor. Subsequently, one of three processes is followed depending on whether the memory cell which is being sensed by the sense circuit is a VO cell, a VF cell or a lockout cell.

For the VO cells, the bit voltage indicates that offset verify latch=false (step 1121). For the VF cells and the lockout cells, the bit voltage indicates that offset verify latch=true (step 1122). For the VO cells, the first transistor (e.g., transistor 1236 in FIG. 12A) blocks the power supply voltage from reaching the drain of the second transistor (step 1123). For the VF cells and the lockout cells, the first transistor passes a power supply voltage (Vdd) to the drain 1237 of a second transistor 1238 (step 1124). At step 1125, the controller provides VsenVF+Vth on the control gate of the second transistor in each sense circuit.

At step 1126, for VO cells, the sense node is not pre-charged and remains at 0 V. At step 1127, for the VF cells and the lockout cells, the sense node is pre-charged to VsenVF. At step 1128, the controller reads the data state latches, for the VO cells, the VF cells and the lockout cells. At step 1129, the data state latches indicate the cell is not locked out, for the VO cells and the VF cells. At step 1130, the data state latches indicate the cell is locked out, for the locked out cells. At step 1131, the controller sets a voltage on LBUS to provide the first transistor in a conductive state, for the VO cells. At step 1132, the controller sets a voltage on LBUS to provide the first transistor in a non-conductive state, for the VF cells and the locked out cells.

At step 1133, the controller provides VsenVO+Vth on the control gate of the second transistor in each sense circuit. At step 1134, the sense node is pre-charged to VsenVO for the VO cells. At step 1135, the sense node remains at VsenVF for the VF cells and the locked out cells.

Figure 11C:
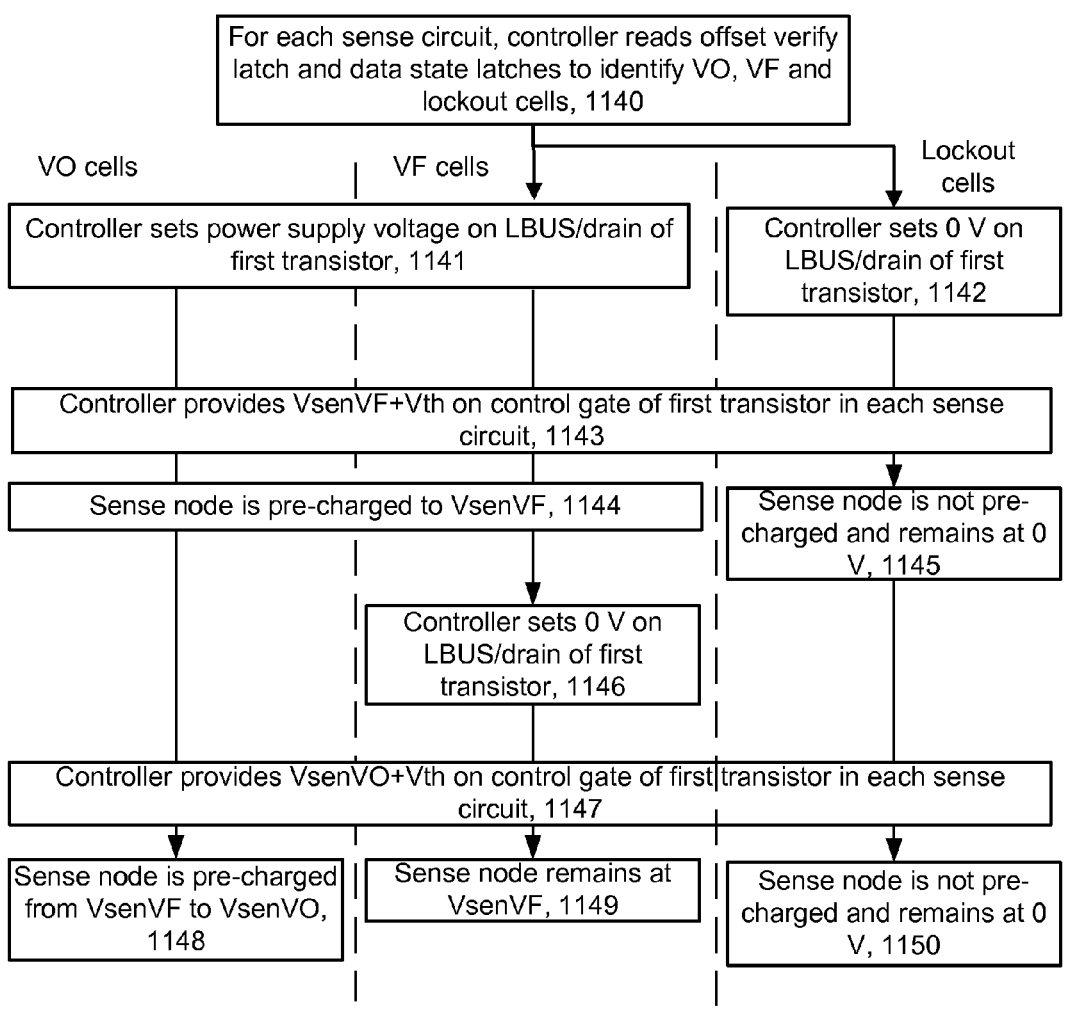
FIG. 11C depicts a flowchart of an example process for implementing the pre-charging case 3 of FIG. 9D.

FIG. 11C depicts a flowchart of an example process for implementing the pre-charging case 3 of FIG. 9D. Refer also to FIGS. 8B, 10C3 and 13. At step 1140, for each sense circuit, the controller reads the offset verify latch and the data state latches to identify VO, VF and locked out cells. Subsequently, one of three processes is followed depending on whether the memory cell which is being sensed by the sense circuit is a VO cell, a VF cell or a lockout cell. For the VO cells and the VF cells, the controller sets a power supply voltage on LBUS, which is connected to the drain of a first transistor (step 1141). For example, see the transistor 1330 which has a drain DR in FIG. 13. For the locked out cells, the controller sets 0 V on LBUS (step 1142). At step 1143, the controller provides VsenVF+Vth on the control gate of the first transistor in each sense circuit.

At step 1144, for VO cells and the VF cells, the sense node is pre-charged to VsenVF. At step 1145, for the lockout cells, the sense node is not pre-charged and remains at 0 V. At step 1146, the controller sets 0 V on LBUS/drain of the first transistor. This prevents further pre-charging of the VF cells. At step 1147, the controller provides VsenVO+Vth on the control gate of the first transistor in each sense circuit. At step 1148, the sense node is pre-charged from VsenVF to VsenVO for the VO cells. At step 1149, the sense node remains at VsenVF for the VF cells. At step 1150, the sense node is not pre-charged and remains at 0 V for the locked out cells.

Figure 11D:
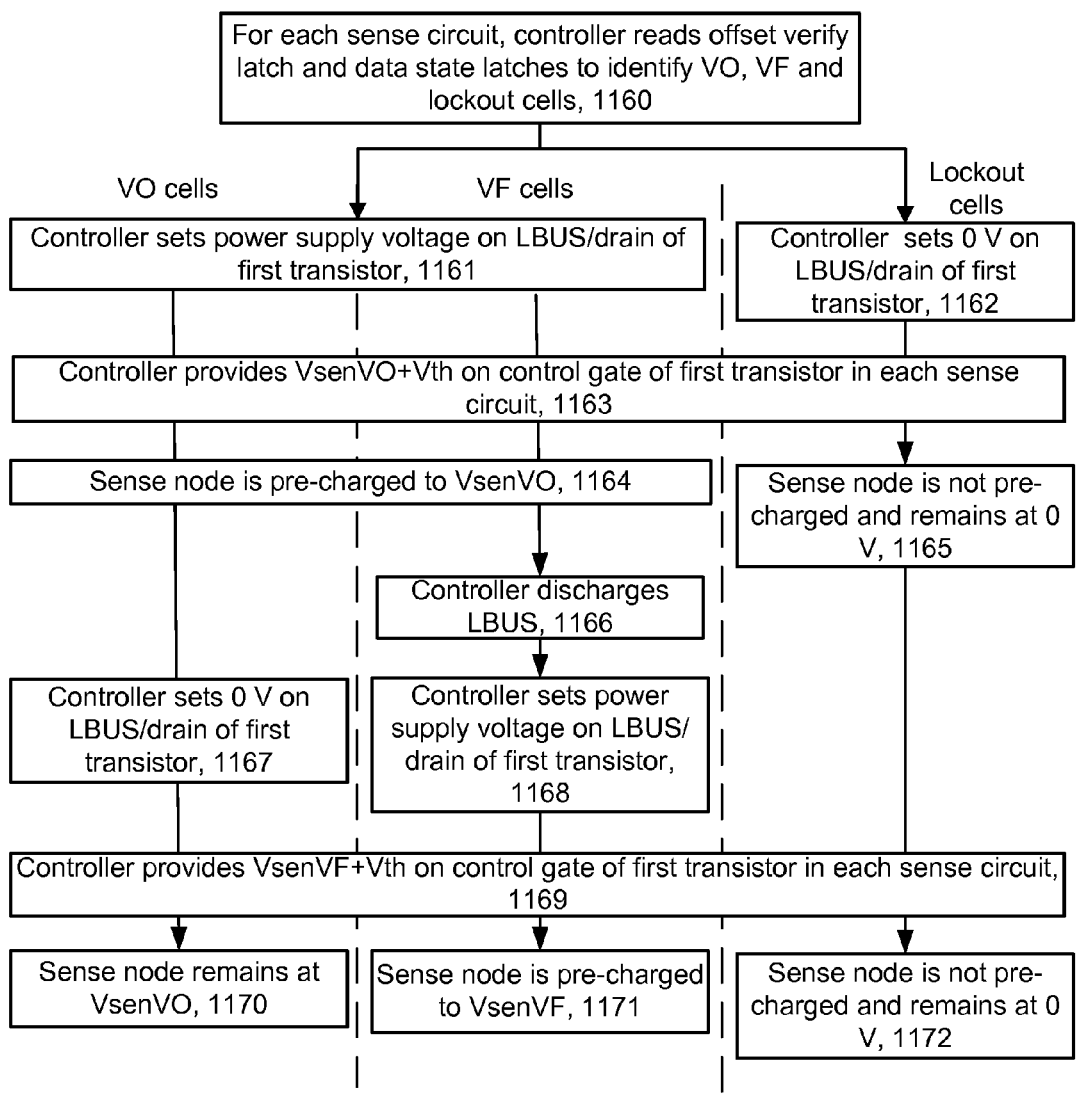
FIG. 11D depicts a flowchart of an example process for implementing the pre-charging case 4 of FIG. 9D.

FIG. 11D depicts a flowchart of an example process for implementing the pre-charging case 4 of FIG. 9D. Refer also to FIGS. 8B, 10C4 and 13. At step 1160, for each sense circuit, the controller reads the offset verify latch and the data state latches to identify VO, VF and locked out cells. Subsequently, one of three processes is followed depending on whether the memory cell which is being sensed by the sense circuit is a VO cell, a VF cell or a lockout cell. For the VO cells and the VF cells, the controller sets a power supply voltage on LBUS, which is connected to the drain of a first transistor (step 1161). For example, see the transistor 1330 which has a drain DR in FIG. 13. For the locked out cells, the controller sets 0 V on LBUS (step 1162). At step 1163, the controller provides VsenVO+Vth on the control gate of the first transistor in each sense circuit.

At step 1164, for VO cells and the VF cells, the sense node is pre-charged to VsenVO. At step 1165, for the lockout cells, the sense node is not pre-charged and remains at 0 V. At step 1166, the controller discharges LBUS for the VF cells. At step 1167, the controller sets 0 V on LBUS/drain of the first transistor. This prevents further pre-charging of the VO cells. At step 1168, for the VF cells, the controller sets a power supply voltage on LBUS. At step 1169, the controller provides VsenVF+Vth on the control gate of the first transistor in each sense circuit. At step 1170, the sense node remains at VsenVO for the VO cells. At step 1171, the sense node is pre-charged from 0 V to VsenVF for the VF cells. At step 1172, the sense node is not pre-charged and remains at 0 V for the locked out cells.

Figure 12A:
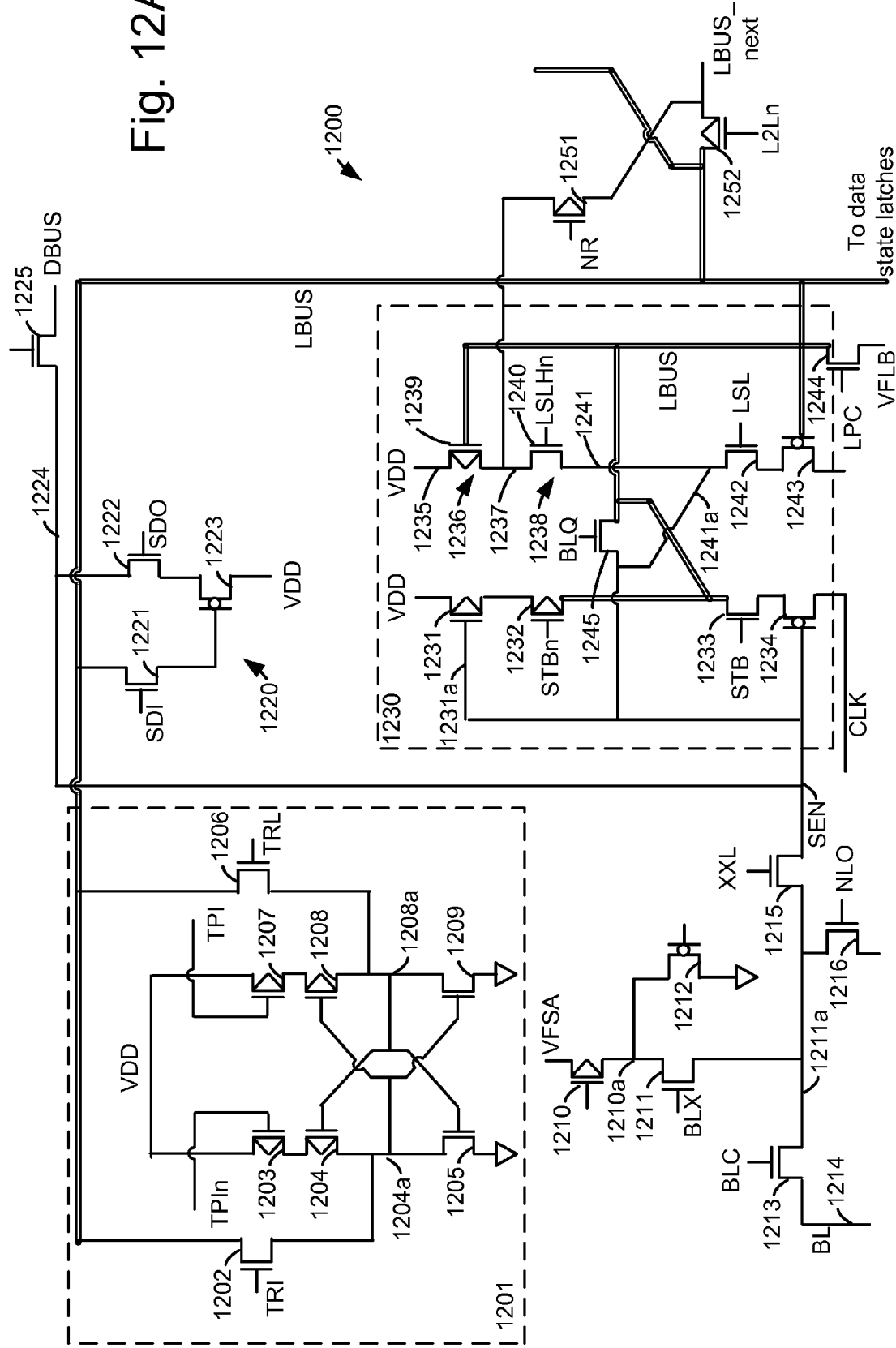
FIG. 12A depicts a first part of a circuit diagram of an example sense circuit, consistent with FIGS. 8A and 8B.

FIG. 12A depicts a first part of a circuit diagram of an example sense circuit 1200, consistent with FIGS. 8A and 8B. Various circuit symbols are used in FIGS. 12A, 12B and 13 to denote transistors. For example, the transistor 1202 is an nMOS, e.g., an n-type metal-oxide-semiconductor field-effect transistor (MOSFET). The transistor 1223 is a pMOS, e.g., a p-type MOSFET. The transistor 1210 is a partially-insulated field-effect transistors (PiFET). A ground potential is represented by an inverted triangle. Various control voltages can be provided from a sense circuit controller. These include a number of control gate voltages such as TRI, TRL, TPIn, TPI, SDI, SDO, BLC, XXL, NLO, STBn, LSLHn, BLQ, STB, LSL, LPC, NR and L2Ln and a clock signal CLK. The control voltages are common to each sense circuit, in one approach.

An offset verify latch 1201 includes a first set of serially connected transistors 1203, 1204 and 1205 and a second set of serially connected transistors 1207, 1208 and 1209. The control gates of the transistors 1208 and 1209 are connected to one another and to a point 1204a between the transistors 1204 and 1205. The control gates of the transistors 1204 and 1205 are connected to one another and to a point 1208a between the transistors 1208 and 1209. The transistor 1202 can be made conductive by the control voltage TRI to pass a voltage from the point 1204a to a local bus, LBUS, which is represented by a double line. Similarly, the transistor 1206 can be made conductive by the control voltage TRL to pass a voltage from the point 1208a to LBUS. In this way, a bit voltage which is stored by the low verify latch can be transferred directly to, and provided on, LBUS. For example, the point 1208a may store the bit voltage of the latch.

A region 1220 of the sense circuit includes transistors 1221, 1222 and 1223 which can connect VDD to LBUS or a data line 1224. The data line can be connected to the data bus DBUS by a transistor 1225. A point 1210a can be connected ground via a transistor 1212.

A sense node SEN may be connected to the bit line 1214 if the transistors 1213 and 1215 are provided in a conductive state. In practice, the transistor 1213 is a voltage clamp (representing the voltage clamp 824 or 844 of FIG. 8A) which sets a voltage on the bit line, and the transistor 1215 (representing the sense node to bit line (BL) switch 823 or 843 of FIG. 8A) is switched to a conductive state at a start of the discharge period during sensing, to electrically connect the sense node to the bit line. The voltage on the bit line is equal to Vblc-Vth of the transistor 1213. A voltage VFSA can be provided to a point 1211*a* using transistors 1210 and 1211, such as for pre-charging of the bit line by providing a sufficiently high drain voltage to the transistor 1213 while a control gate voltage is applied to the transistor 1213. A transistor 1216 is also connected to the point 1211*a*.

A trip latch 1230 includes a first set of serially connected transistors 1231, 1232, 1233 and 1234 and a second set of serially connected transistors 1236, 1238, 1242 and 1243. The transistor 1236 includes a drain 1235 which is connected to VDD and a source which is connected to the drain 1237 of the transistor 1238. Point 1241 is a source of the transistor 1238. A line 1231*a* is connected to a control gate of the transistor 1231, to the sense node and to LBUS (via a transistor 1245). LBUS is connected to the control gate 1239 of the transistor 1236, to the control gate of the transistor 1243, to the drain of the transistor 1244 (which has a terminal VFLB) and to a transistor 1252 (which has a terminal LBUS next). The drain 1237 of the transistor 1238 is also connected to a transistor 1251.

In the trip latch, the voltage on LBUS is a control gate voltage of the transistor 1236 which provides the transistor 1236 in a conductive or non-conductive state. In the conductive state, VDD is passed to the transistor 1238 (representing the voltage clamp 821 or 841 of FIG. 8A), so that the transistor can provide a voltage at the point 1241 which is equal to the control gate voltage of the transistor 1238 minus its threshold voltage. The point 1241 is directly connected to the sense node via a line 1241*a*. The voltage Vlslhn is a voltage of a control gate 1240 of the transistor 1238 which sets the pre-charge voltage on the sense node, assuming the transistor 1236 is in a conductive state and has passed the power supply voltage to the transistor 1238. If the transistor 1236 is in a non-conductive state and has not passed the power supply voltage to the transistor 1238, the transistor 1238 cannot set a pre-charge voltage.

Figure 12B:
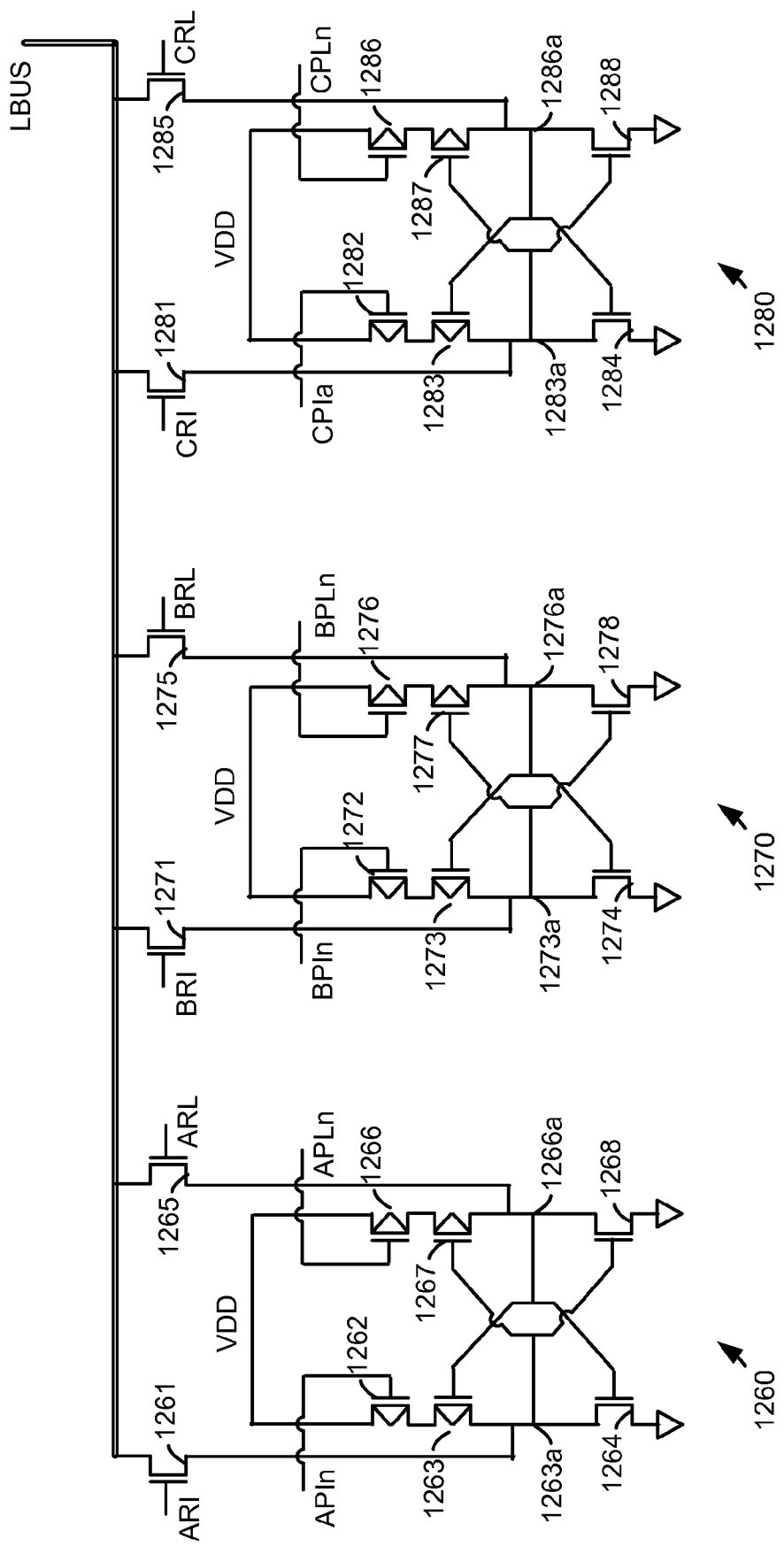
FIG. 12B depicts a second part of the circuit diagram of FIG. 12A.

FIG. 12B depicts a second part of the circuit diagram of FIG. 12A. Three latches 1260, 1270 and 1280, e.g., first, second and third data state latches, respectively, are provided as an example. In one approach, three bits are stored, one in each latch, to identify one of eight possible data states, including the erased state which may use the same bit combination as the lockout state. Each latch has a similar configuration and can be connected to LBUS to transfer a bit voltage to LBUS and then to the sense circuit controller via DBUS. Various control voltages can be provided from a sense circuit controller. These include a number of control gate voltages such as ARI, ARL, APIn, APLn, BRI, BRL, BPIn, BPLn, CRI, CRL, CPIa and CPLn. The control voltages are common to each sense circuit, in one approach.

The data state latch 1260 includes a first set of serially connected transistors 1262, 1263 and 1264 and a second set of serially connected transistors 1266, 1267 and 1268. The control gates of the transistors 1263 and 1264 are connected to one another and to a point 1266*a* between the transistors 1267 and 1268. The control gates of the transistors 1267 and 1268 are connected to one another and to a point 1263*a* between the transistors 1263 and 1264. The transistor 1261 can be made conductive by the control voltage ARI to pass a voltage from the point 1263*a* to LBUS. The point 1263*a* may store the bit voltage of the latch. Similarly, the transistor 1265 can be made conductive by the control voltage ARL to pass a voltage from the point 1266*a* to LBUS. In this way, a bit voltage which is stored by the data state latch can be transferred directly to, and provided on, LBUS.

The data state latch 1270 includes a first set of serially connected transistors 1272, 1273 and 1274 and a second set of serially connected transistors 1276, 1277 and 1278. The control gates of the transistors 1273 and 1274 are connected to one another and to a point 1276*a* between the transistors 1277 and 1278. The control gates of the transistors 1277 and 1278 are connected to one another and to a point 1273*a* between the transistors 1273 and 1274. The point 1273*a* may store the bit voltage of the latch. The transistor 1271 can be made conductive by the control voltage BRI to pass a voltage from the point 1273*a* to LBUS. Similarly, the transistor 1275 can be made conductive by the control voltage ARL to pass a voltage from the point 1276*a* to LBUS. In this way, a bit voltage which is stored by the data state latch can be transferred directly to, and provided on, LBUS.

The data state latch 1280 includes a first set of serially connected transistors 1282, 1283 and 1284 and a second set of serially connected transistors 1286, 1287 and 1288. The control gates of the transistors 1283 and 1284 are connected to one another and to a point 1286*a* between the transistors 1287 and 1288. The control gates of the transistors 1287 and 1288 are connected to one another and to a point 1283*a* between the transistors 1283 and 1284. The point 1283*a* may store the bit voltage of the latch. The transistor 1281 can be made conductive by the control voltage CRI to pass a voltage from the point 1283*a* to LBUS. Similarly, the transistor 1285 can be made conductive by the control voltage CRL to pass a voltage from the point 1286*a* to LBUS. In this way, a bit voltage which is stored by the data state latch can be transferred directly to, and provided on, LBUS.

During sensing, pre-charging of LBUS based on the bit value in the offset verify latch 1201 at the point 1208*a* occurs via the transistor 1206. Pre-charging of the sense node occurs via the transistors 1236 and 1238. A conditional pre-charge of the LBUS based on the data state latches occurs via the point 1263*a* and the transistor 1261 in the latch 1260, the point 1273*a* and the transistor 1271 in the latch 1270, and the point 1283*a* and the transistor 1281 in the latch 1280.

Figure 13:
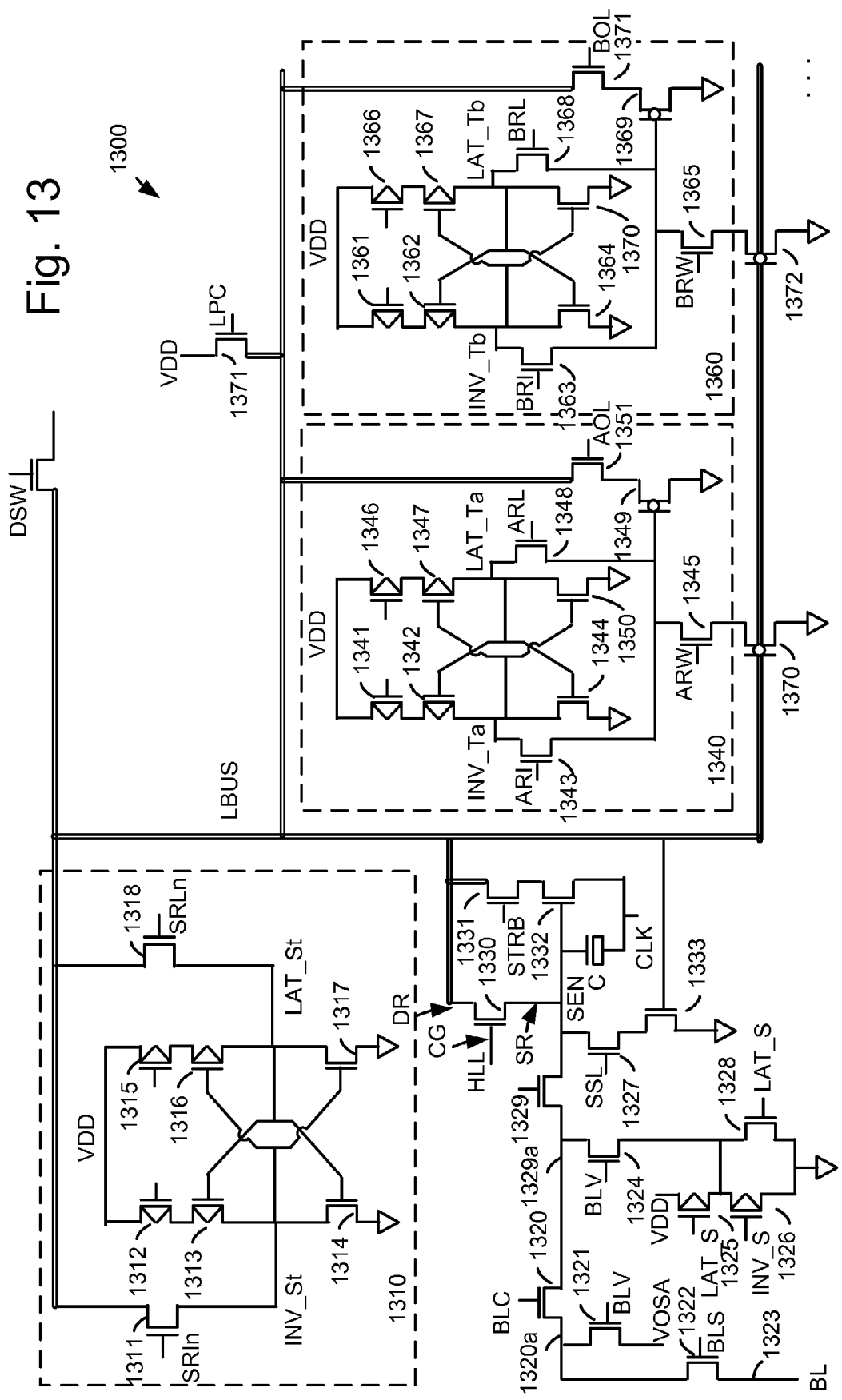
FIG. 13 depicts a circuit diagram of another example sense circuit, consistent with FIGS. 8A and 8B.

FIG. 13 depicts a circuit diagram of another example sense circuit 1300, consistent with FIGS. 8A and 8B. Various control voltages can be provided from a sense circuit controller. These include a number of control gate voltages such as SRIn, SRLn, DSW, BLC, BLV, BLS, LAT_S, INV_S, BLV, SSL, HLL, STRB, CLK, LPC, INV_T, LAT_T, ARI, ARL, ARW, AOL, BRI, BRL, BRW and BOL and a clock signal CLK. The control voltages are common to each sense circuit, in one approach.

A trip latch 1310 includes a first set of serially connected transistors 1312, 1313 and 1314 and a second set of serially connected transistors 1315, 1316 and 1317. The control gates of the transistors 1313 and 1314 are connected to one another and to a point LAT_St between the transistors 1316 and 1317. The control gates of the transistors 1316 and 1317 are connected to one another and to a point INV_St between the transistors 1313 and 1314. The transistor 1311 can be made conductive by the control voltage SRIn to pass a voltage from the point INV_St to LBUS. Similarly, the transistor 1318 can be made conductive by the control voltage SRLn to pass a voltage from the point LAT_St to LBUS. In this way, a bit voltage which is stored by the trip latch can be transferred directly to, and provided on, LBUS. Similarly, a bit value can be set in the trip latch based on a decay of the sense node, SEN.

A number of data state latches can be provided. As an example, a first data state latch 1340 and a second data state latch 1360 are depicted. The first data state latch 1340 includes a first set of serially connected transistors 1341, 1342 and 1344 and a second set of serially connected transistors 1346, 1347 and 1348. The control gates of the transistors 1342 and 1344 are connected to one another and to a point LAT_Ta between the transistors 1347 and 1350. The control gates of the transistors 1347 and 1350 are connected to one another and to a point INV_Ta between the transistors 1342 and 1344. The transistor 1343 can be made conductive by the control voltage ARI to pass a voltage from the point INV_Ta to LBUS via transistor 1345. Similarly, the transistor 1348 can be made conductive by the control voltage ARL to pass a voltage from the point LAT_Ta to LBUS. In this way, a bit voltage which is stored by the data state latch can be provided on LBUS or set by LBUS. LAT_Ta can also be connected to ground via the transistors 1348 and 1349. LBUS can be connected to ground via the transistors 1351 and 1349. A transistor 1370 is responsive to LBUS to control whether the data state latch 1340 is connected to ground.

The second data state latch 1360 includes a first set of serially connected transistors 1361, 1362 and 1364 and a second set of serially connected transistors 1366, 1367 and 1368. The control gates of the transistors 1362 and 1364 are connected to one another and to a point LAT_Tb between the transistors 1367 and 1370. The control gates of the transistors 1367 and 1370 are connected to one another and to a point INV_Tb between the transistors 1362 and 1364. The transistor 1363 can be made conductive by the control voltage BRI to pass a voltage from the point INV_Tb to LBUS via transistor 1365. Similarly, the transistor 1368 can be made conductive by the control voltage BRL to pass a voltage from the point LAT_Tb to LBUS. In this way, a bit voltage which is stored by the data state latch can be provided on LBUS or set by LBUS. LAT_Tb can also be connected to ground via the transistors 1368 and 1369. LBUS can be connected to ground via the transistors 1371 and 1369. A transistor 1372 is responsive to LBUS to control whether the data state latch 1360 is connected to ground.

LBUS is connected to a drain of the transistor 1330 (representing the voltage clamp 824 or 844 of FIG. 8A) to supply a voltage which allows the transistor to set a pre-charge voltage on the sense node as the control gate voltage Vhll minus the Vth of the transistor. Each sense circuit can therefore be configured to provide a pre-charge or not provide a pre-charge while a common Vhll is provided to the sense circuits. That is, if LBUS is at 0 V or another low value, no pre-charge is provided. If LBUS is at a sufficiently high voltage (based on a power supply voltage passed by the transistor 1371), the transistor 1330 provides Vhll-Vth at its source to the sense node. The transistor 1371 provides a voltage on LBUS which is equal to Vlpc-Vth of the transistor.

The transistor 1329 (representing the sense node to bit line (BL) switch 823 or 843 of FIG. 8A) allows the sense node to communicate with the bit line 1323 at the start of the discharge period of the sensing process. The transistor 1320 sets a pre-charge voltage of the bit line, and the transistor 1322 connects the bit line to the transistor 1320.

A transistor 1321 connects the point 1320a to a voltage VOSA. Transistors 1325 and 1326 are provided between a power supply and ground. Transistors 1324 and 1328 are provided between a point 1329a and ground. A capacitor C is charged by the sense node and by a clock signal. The sense node is at the source side of the transistor 1330 so that it can be pre-charged by this transistor. The voltage of the sense node is provided on the control gate of the transistor 1332, which is a voltage sensing transistor. Accordingly, at the sense time, the transistor 1332 will be in a conductive state if there is a small amount of discharge or in a non-conductive state if there is a large amount of discharge. A latch value is set to 0 or 1 and output via the bus to the sense circuit controller according to whether the transistor 1332 is in a conductive or non-conductive state, indicating that the selected memory cell is in a non-conductive or conductive state, respectively. For example, the transistor 1331 can be made conductive to attempt to flip the latch 1310. In one approach, the latch is flipped if the transistor 1332 conductive, or not flipped if the transistor 1332 is not conductive.

Transistors 1327 and 1333 can connect the sense node to ground.

During sensing, pre-charging of LBUS occurs via the transistors 1371 and 1330, and pre-charging of the sense node occurs via the transistor 1330. A discharge of the sense node can occur via the transistors 1330 and 1351.

Accordingly, it can be seen that, in one embodiment, an apparatus comprises: a first sense circuit comprising a first sense node, the first sense circuit is associated with a first memory cell; a second sense circuit comprising a second sense node, the second sense circuit is associated with a second memory cell; and a control circuit. The control circuit is associated with the first sense circuit and with the second sense circuit and is configured to, in a sensing operation: pre-charge the first sense node to a respective voltage; pre-charge the second sense node to a respective voltage which is lower than the first sense node voltage; and while a control gate voltage is applied to the first memory cell and the second memory cell, allow the first sense node voltage and the second sense node voltage to discharge in a discharge period.

In another embodiment, a method comprises: in a verify operation of a program-verify iteration of a program operation: if one or more latches indicate a threshold voltage of a memory cell has not yet reached an offset verify voltage of a data state, pre-charging a sense node in a sense circuit to a higher sense node voltage, the sense circuit is associated with the memory cell and a bit line; if the one or more latches indicate the threshold voltage has reached the offset verify voltage, pre-charging the sense node to a lower sense node voltage, lower than the first sense node voltage; connecting the sense node to the bit line for a time period while a control gate voltage is applied to the memory cell; and at an end of the time period, determining whether a voltage of the sense node has decayed below a trip voltage, wherein the time period and the trip voltage are independent of whether the sense node is pre-charged to the first sense node voltage or the second sense node voltage.

The method further comprises: if the voltage of the sense node has not decayed below the trip voltage, provide a positive voltage on the bit line during a program voltage in a next program-verify iteration of the program operation, wherein the positive voltage slows a programming speed of the memory cell; and if the voltage of the sense node has decayed below the trip voltage, provide 0 V on the bit line during the program voltage in the next program-verify iteration of the program operation to avoid slowing the programming speed of the memory cell.

In another embodiment, an apparatus comprises: means for in a verify operation of a program-verify iteration of a program operation: if one or more latches indicate a threshold voltage of a memory cell has not yet reached an offset verify voltage of a data state, pre-charging a sense node in a sense circuit to a higher sense node voltage, the sense circuit is associated with the memory cell and a bit line; if the one or more latches indicate the threshold voltage has reached the offset verify voltage, pre-charging the sense node to a lower sense node voltage, lower than the first sense node voltage; connecting the sense node to the bit line for a time period while a control gate voltage is applied to the memory cell; and at an end of the time period, determining whether a voltage of the sense node has decayed below a trip voltage, wherein the time period and the trip voltage are independent of whether the sense node is pre-charged to the first sense node voltage or the second sense node voltage.

The apparatus further comprises: means for if the voltage of the sense node has not decayed below the trip voltage, providing a positive voltage on the bit line during a program voltage in a next program-verify iteration of the program operation, wherein the positive voltage slows a programming speed of the memory cell; and means for if the voltage of the sense node has decayed below the trip voltage, providing 0 V on the bit line during the program voltage in the next program-verify iteration of the program operation to avoid slowing the programming speed of the memory cell.

In another embodiment, a method comprises: providing a signal to a latch, the signal causes a bit which is stored by the latch to be provided on a bus, wherein the latch and the bus are in a sense circuit associated with a memory cell and a bit line, the bit is represented by a first bit voltage if a threshold voltage of the memory cell has not yet reached an offset verify voltage of a data state, and a second bit voltage if the threshold voltage of the memory cell has reached the offset verify voltage of the data state, the offset verify voltage is below a final verify voltage of the data state, and the bus is connected to a control gate of a first transistor in the sense circuit; while the bit is provided on the bus, providing first voltage to a second transistor in the sense circuit, wherein the first transistor is between the second transistor and a power supply, and when the first voltage is provided to the second transistor, the second transistor pre-charges a sense node of the sense circuit to a first sense node voltage if the bit is represented by the first bit voltage and does not pre-charge the sense node to the first sense node voltage if the bit is represented by the second bit voltage; reading bits from additional latches associated with the sense circuit; determining from the bits from the additional latches that the threshold voltage of the memory cell has not exceeded the final verify voltage of the data state; and in response to the determining that the threshold voltage of the memory cell has not exceeded the final verify voltage, providing a voltage on the bus which provides the first transistor in a conductive state and providing a second voltage, lower than the first voltage, to the second transistor in the sense circuit.

In another embodiment, a memory controller comprises: a storage device comprising a set of instructions and a processor operable to execute the set of instructions. The set of instructions comprises instructions for performing each of the steps in the above-mentioned methods.

In another embodiment, a system comprises: a sense circuit comprising a bus, a latch, a sense node, a first transistor and a second transistor, wherein the bus is connected to a control gate of the first transistor, the first transistor is between the second transistor and a power supply, and the sense circuit is associated with a memory cell; additional latches associated with the sense circuit; and a sense circuit controller. The sense circuit controller is configured to: provide a signal to the latch, the signal causes a bit which is stored by the latch to be provided on the bus, wherein the bit is represented by a first bit voltage (1) if a threshold voltage of the memory cell has not yet reached an offset verify voltage of a data state, and a second bit voltage (0) if the threshold voltage of the memory cell has reached the offset verify voltage of the data state, the offset verify voltage is below a final verify voltage of the data state; while the bit is provided on the bus, provide a first voltage (LSLH=high) to the second transistor (1238), and when the first voltage is provided to the second transistor, cause the second transistor to pre-charge the sense node to a first sense node voltage (high) if the bit is represented by the first bit voltage and to not pre-charge the sense node to the first sense node voltage if the bit is represented by the second bit voltage; read bits from the additional latches; determine from the bits from the additional latches that the threshold voltage of the memory cell has not exceeded the final verify voltage of the data state; and in response to the determining that the threshold voltage of the memory cell has not exceeded the final verify voltage, provide a voltage on the bus which provides the first transistor in a conductive state and provide a second voltage, lower than the first voltage, to the second transistor.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a first sense circuit comprising a first sense node, the first sense circuit is associated with a first memory cell;
a second sense circuit comprising a second sense node, the second sense circuit is associated with a second memory cell; and
a control circuit, the control circuit is associated with the first sense circuit and with the second sense circuit and is configured to, in a sensing operation:
pre-charge the first sense node to a first sense node voltage;
pre-charge the second sense node to a second sense node voltage which is lower than the first sense node voltage, wherein the first sense node has the first sense node voltage and the second sense node has the second sense node voltage at a start of a discharge period;
while a control gate voltage is applied to the first memory cell and the second memory cell, allow the first sense node to discharge from the first sense node voltage and allow the second sense node to discharge from the second sense node voltage in the discharge period; and sense a conductive or non-conductive state of each of the first and second memory cells at an end of the discharge period.

2. The apparatus of claim 1, wherein:
the first sense circuit comprises a first trip latch;
the second sense circuit comprises a second trip latch; and
the control circuit is configured to, at the end of the discharge period, set the first trip latch based on a value of the first sense node voltage relative to a reference voltage, and set the second trip latch based on a value of the second sense node voltage relative to the reference voltage.

3. The apparatus of claim 1, wherein:
the control circuit is configured to perform the pre-charge of the first sense node responsive to a determination that the first memory cell has a threshold voltage below the control gate voltage; and
the control circuit is configured to perform the pre-charge of the second sense node responsive to a determination that the second memory cell has a threshold voltage above the control gate voltage.

4. The apparatus of claim 3, wherein:
the control gate voltage is an offset verify voltage of a data state; and
the offset verify voltage is below a final verify voltage of the data state.

5. The apparatus of claim 4, wherein:
the sensing operation comprises a verify operation.

6. The apparatus of claim 1, wherein:
the control circuit is configured to perform the pre-charge of the first sense node to the first sense node voltage at the start of a discharge period responsive to a determination that the first memory cell is to be programmed to one data state;
the control circuit is configured to perform the pre-charge of the second sense node responsive to a determination that the second memory cell is to be programmed to another data state which is below the one data state; and
the sensing operation comprises a verify operation.

7. The apparatus of claim 1, wherein:
at a first time in the sensing operation, the control circuit is configured to perform the pre-charge of the first sense node; and
at a second time in the sensing operation, different than the first time, the control circuit is configured to perform the pre-charge of the second sense node.

8. The apparatus of claim 1, wherein at a first time, the control circuit is configured to:
apply a first voltage to a transistor in the first sense circuit and to a transistor in the second sense circuit, the first voltage is at least equal to a sum of the first sense node voltage and a threshold voltage of the transistor in the first sense circuit;
apply a power supply voltage to a drain of the transistor in the first sense circuit, wherein the transistor in the first sense circuit performs the pre-charge of the first sense node; and
block the power supply voltage from a drain of the transistor in the second sense circuit, wherein the transistor in the second sense circuit does not perform the pre-charge of the second sense node to the second sense node voltage at the first time; and
at a second time which is after the first time, the control circuit is configured to:
apply a second voltage to the transistor in the first sense circuit and to the transistor in the second sense circuit, the second voltage is at least equal to a sum of the second sense node voltage and the threshold voltage of the transistor in the first sense circuit, and is lower than the first voltage;
apply the power supply voltage to the drain of the transistor in the first sense circuit, wherein the first sense node voltage is maintained at the first sense node; and
apply the power supply voltage to the drain of the transistor in the second sense circuit, wherein the transistor in the second sense circuit performs the pre-charge of the second sense node.

9. The apparatus of claim 1, wherein at a first time, the control circuit is configured to:
apply a voltage to a transistor in the second sense circuit and to a transistor in the first sense circuit, the voltage applied to the transistor in the second sense circuit is at least equal to a sum of the second sense node voltage and a threshold voltage of the transistor in the second sense circuit; and
apply a power supply voltage to a drain of the transistor in the second sense circuit, wherein the transistor in the second sense circuit performs a pre-charge of the second sense node to the second sense node voltage;
block the power supply voltage from a drain of the transistor in the first sense circuit, wherein the transistor in the first sense circuit does not perform a pre-charge of the first sense node to the second sense node voltage; and
wherein at a second time which is after the first time, the control circuit is configured to:
apply a voltage to the transistor in the second sense circuit and to the transistor in the first sense circuit, the first voltage is at least equal to a sum of the first sense node voltage and the threshold voltage of the transistor in the second sense circuit;
block the power supply voltage from the drain of the transistor in the second sense circuit, wherein the transistor in the second sense circuit does not perform a pre-charge of the second sense node to the first sense node voltage; and
apply the power supply voltage to the drain of the transistor in the first sense circuit, wherein the transistor in the first sense circuit performs the pre-charge of the first sense node.

10. The apparatus of claim 1, wherein at a first time, the control circuit is configured to:
apply a voltage to a transistor in the first sense circuit and to a transistor in the second sense circuit, the voltage applied to the transistor in the second sense circuit is at least equal to a sum of the second sense node voltage and a threshold voltage of the transistor in the first sense circuit; and
apply a power supply voltage to a drain of the transistor in the first sense circuit, wherein the transistor in the first sense circuit performs a pre-charge of the first sense node to the second sense node voltage and the transistor in the second sense circuit performs the pre-charge of the second sense, and
wherein at a second time which is after the first time, the control circuit is configured to:
apply a voltage to the transistor in the first sense circuit and to the transistor in the second sense circuit, the first voltage is at least equal to a sum of the first sense node voltage and the threshold voltage of the transistor in the first sense circuit;
apply the power supply voltage to the drain of the transistor in the first sense circuit, wherein the transistor in the first sense circuit performs the precharge of the first sense node; and block the power supply voltage from the drain of the transistor in the second sense circuit, wherein the transistor in the second sense circuit does not perform a pre-charge of the second sense node to the first sense node voltage.

11. The apparatus of claim 1, wherein at a first time, the control circuit is configured to:

apply a first voltage to a transistor in the first sense circuit and to a transistor in the second sense circuit, the first voltage is at least equal to a sum of the first sense node voltage and a threshold voltage of the transistor in the first sense circuit; and apply a power supply voltage to a drain of the transistor in the first sense circuit and to a drain of the transistor in the second sense circuit, wherein the transistor in the first sense circuit performs a pre-charge of the first sense node to the first sense node voltage and the transistor in the second sense circuit performs the pre-charge of the second sense node;

subsequently discharge the second sense node; and wherein the control circuit is configured to, at a second time which is after the first time:

apply a voltage to the transistor in the first sense circuit and to the transistor in the second sense circuit which is at least equal to a sum of the second sense node voltage and the threshold voltage of the transistor in the first sense circuit;

apply the power supply voltage to the drain of the transistor in the second sense circuit, wherein the transistor in the second sense circuit performs the pre-charge of the second sense node; and maintain the first sense node voltage at the first sense node.

12. The apparatus of claim 11, wherein:
the control circuit, to maintain the first sense node voltage, is configured to apply the power supply voltage to the drain of the transistor in the first sense circuit.

13. The apparatus of claim 11, wherein:
the control circuit, to maintain the first sense node voltage, is configured to block the power supply voltage from the drain of the transistor in the first sense circuit.

14. The apparatus of claim 1, wherein:
the first memory cell and the second memory cell are arranged in a three-dimensional memory structure.

15. The apparatus of claim 1, wherein:
the sensing operation concurrently tests the first memory cell at a first verify voltage and the second memory cell at a second verify voltage which is greater than the first verify voltage.

16. The apparatus of claim 15, wherein:
the first verify voltage is an offset verify voltage of a data state; and
the second verify voltage is a final verify voltage of the data state.

17. The apparatus of claim 16, wherein:
the offset verify voltage is below the final verify voltage of the data state.

18. The apparatus of claim 15, wherein:
the second verify voltage is equal to the control gate voltage.

* * * * *